(12) United States Patent
Ikawa et al.

(10) Patent No.: US 6,528,595 B1
(45) Date of Patent: Mar. 4, 2003

(54) ADHESIVE OF THIIRANE AND OXIRANE-CONTAINING COMPOUND AND OXIRANE-CONTAINING COMPOUND

(75) Inventors: Masahiro Ikawa, Kanagawa (JP);
Hiroyuki Okuhira, Kanagawa (JP);
Keisuke Chino, Kanagawa (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 0 days.

(21) Appl. No.: 09/647,863

(22) PCT Filed: Jul. 27, 1999

(86) PCT No.: PCT/JP99/04019

§ 371 (c)(1),
(2), (4) Date: Oct. 6, 2000

(87) PCT Pub. No.: WO00/46317

PCT Pub. Date: Aug. 10, 2000

(30) Foreign Application Priority Data

| Feb. 8, 1999 | (JP) | ............................................. | 11-030123 |
| Mar. 15, 1999 | (JP) | ............................................. | 11-068319 |
| Apr. 28, 1999 | (JP) | ............................................. | 11-121653 |
| May 13, 1999 | (JP) | ............................................. | 11-132796 |

(51) Int. Cl.$^7$ .......................... C08G 59/14; C08L 63/00; C08L 63/02
(52) U.S. Cl. ...................... 525/525; 523/451; 525/481; 525/487; 525/488; 525/490; 525/496; 525/497; 525/510; 525/523; 525/533; 524/109; 524/119; 524/147; 524/151; 524/153; 528/109; 528/380
(58) Field of Search .................. 528/109, 380; 525/523, 525, 481, 486, 488, 490, 496, 497, 510, 533; 523/451; 524/109, 119, 147, 151, 153

(56) References Cited

U.S. PATENT DOCUMENTS

| 3,378,522 A | | 4/1968 | Martin ........................ 260/47 |
| 3,637,591 A | * | 1/1972 | Coran |
| 3,716,557 A | * | 2/1973 | Uelzmann |
| 5,073,601 A | * | 12/1991 | Mulhaupt et al. ........... 525/109 |
| 5,182,340 A | * | 1/1993 | Hefner et al. ............... 525/525 |
| 6,045,873 A | * | 4/2000 | Adachi et al. .............. 427/410 |

FOREIGN PATENT DOCUMENTS

| CA | 765464 A | * | 1/1968 |
| CH | 586732 A | * | 4/1977 |
| CZ | 166480 B | * | 2/1976 |
| EP | 0 874 016 | | 10/1998 |
| GB | 968424 | | 9/1964 |
| GB | 1503213 A | * | 3/1978 |
| JP | 50-62188 A | * | 5/1975 |
| JP | 5-132541 | | 12/1991 |
| JP | 4-202420 A | * | 7/1992 |
| JP | 4-202523 A | * | 7/1992 |
| JP | 5-230182 | | 9/1992 |
| JP | 5-132541 A | * | 5/1993 |
| JP | 7-196800 | | 12/1993 |
| JP | 7-196800 A2 | * | 8/1995 |
| JP | 10-60230 A | * | 3/1998 |
| JP | 10-204152 A2 | * | 8/1998 |
| SU | 642339 A | * | 1/1979 |

OTHER PUBLICATIONS

Chemical abstracts accession No. 1973: 125252, Penczek et al., Plaste Kaut. (1973), vol. 20, No. 3, pp. 176–178.*
Chemical abstracts accession No. 1981:47030, Tyvorskii et al., Vestsi Akad. Navuk BSSR, Ser. Khim. Navuk (1980), No. 4, pp. 76–82.*
Chemical abstracts accession No. 1992:175371, Vecera et al., Angew. Makromol. Chem. (1991), vol. 193, pp. 29–37.*
Chemical abstracts accession No. 1996:531410, Bell et al., Angew. Makromol. Chem. (1996), vol. 240, pp. 67–81.*
Chemical abstracts accession No. 1997:485315, Voong et al., 20$^{th}$ Proceedings of the Annual Meeting of the Adhesive Society (1997), pp. 203–205.*

* cited by examiner

*Primary Examiner*—Robert E. L. Sellers
(74) *Attorney, Agent, or Firm*—Finnegan, Henderson, Farabow, Garrett & Dunner LLP

(57) ABSTRACT

A composition useful as a sealant, coating, a potting agent for a printed circuit board, a prepreg or an adhesive comprises a compound (A) wherein all or a part of the oxirane rings in an epoxy compound is replaced with thiirane rings represented by the following formula (1):

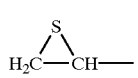

(1)

or compound (A) and compound (B) which contains oxirane rings and no thiirane ring in the molecule, wherein the ratio of oxirane ring/thiirane ring is from 90/10 to 10/90.

10 Claims, 1 Drawing Sheet

ADHESIVE OF THIIRANE AND OXIRANE-CONTAINING COMPOUND AND OXIRANE-CONTAINING COMPOUND

TECHNICAL FIELD

This invention relates to various resin compositions comprising a resin component containing compound (A) wherein or a part of oxirane ring in an epoxy compound is replaced with thiirane ring; or the compound (A) and compound (B) which contains oxirane ring and no thiirane ring in the molecule.

More specifically, this invention relates to:

(i) an adhesive composition comprising the resin component as described above;

(ii) a resin composition for a sealant exhibiting excellent adhesion and tensile strength comprising the resin component as described above and another particular resin;

(iii) a resin composition for a coating composition and a coating agent comprising the resin component as described above exhibiting excellent curability, adhesion to adherend, and reduced odor without detracting from pot life;

(iv) a resin composition for electric applications comprising the resin component as described above which quickly develops electric insulation, which exhibits flame retardancy, excellent curability and strong adhesion to metal substrate, and which can be used for potting of print circuit boards and as a resin for impregnation in prepregs;

(v) a resin composition comprising the resin component as described above exhibiting excellent fast curing, and in particular, fast curing at low temperatures as well as high storage stability at high temperatures;

(vi) a resin composition suitable for use as an adhesive and the like comprising the resin component as described above and a particular phosphite ester, which exhibits excellent adhesion, curability at low temperatures, reduced odor, and good storage stability;

(vii) a fast curing, one part resin composition suitable for use as a coating composition, adhesive and the like comprising the resin component as described above and a particular ketimine, which exhibits excellent curability at low temperatures and storage stability; and (viii) a resin composition further comprising a reactive diluent capable of reducing viscosity of the composition, and which exhibits no clouding of the composition by the crystallization of the resin component as described above.

BACKGROUND ART

Epoxy resin-based adhesives are widely used in various industrial fields since they exhibit satisfactory adhesion to a variety of materials such as metals, plastics, woods, glass, concrete, and ceramics, and at the same time, excellent heat resistance, chemical resistance, electric insulation, and the like. Accordingly, they are used as an adhesive for supporting the structure of automobiles and airplanes, and as an adhesive for civil engineering and construction purposes.

Recently, epoxy resin-based adhesives are also finding their use in the field of electrical and electronic engineering since they are excellent in properties such as heat resistance band electric insulation and the gas generated and shrinkage in the course of curing are reduced.

For example, Epoxy resin-based adhesives are used as a potting agent for physical and chemical protection and fixation of print circuit boards and as a resin for impregnation in prepregs. As a consequence of such widening in the range of their application, there is a demand for epoxy resin-based adhesives to have further improved electric insulation, flame retardancy, and adhesion. There is also a demand for further reduction in curing time without detracting from their electric insulation for the purpose of shortening the production period.

In spite of such situation, most of the conventional epoxy resin compositions have been two part compositions comprising the main part and the curing agent. Such two part compositions suffer from short pot life since the curing reaction starts immediately after the mixing of the components, and as a consequence, the composition suffered from poor workability.

A typical method for extending the pot life is use of a latent curing agent, for example, a block isocyanate-modified epoxy resin. A latent curing agent, however, is an agent primarily developed for curing by heat application, and the performance upon drying at room temperature has been far from being acceptable for practical use. Another method is use of a resin with low reactivity, for example, an aliphatic epoxy resin for the main part. This method, however, suffers from reduced working efficiency due to inferior drying properties and markedly delayed formation of the surface film despite the extended pot life.

The composition can be imparted with fast curing properties when a thiol compound is used as a curing agent. Thiol compounds, however, suffer from bad odor and use of such compounds invites worsening in the work environment.

Adhesive strength of the epoxy resin-based adhesives has been conceived to be developed mainly by the hydroxyl group which is generated as a result of the curing reaction. This hydroxyl group, however, has low reactivity (acidity), and the adhesive strength is believed to be developed by physical affinity. Accordingly, introduction in the molecule of a highly reactive functional group which can generate a substituent having a chemical reactivity higher than that of the hydroxyl group upon curing may result in the production of an adhesive which exhibits stronger adhesive strength and faster curing compared to the conventional epoxy resin-based adhesives or a coating composition, a coating agent, or a potting agent which exhibits stronger adhesion or bonding to the substrate as well as faster curing compared to the conventional epoxy resin composition.

In the case of the two part, room temperature-curable epoxy resin-based adhesive used in outdoors, balance between the pot life and the curing speed is important. The adhesives wherein an aliphaticpolyamine is used for the curing agent had the merit of high curing speed while they suffered from short pot life. On the other hand, the adhesives wherein an alicyclic polyamine compound is used for the curing agent had the merit of extended pot life and reduced heat generation while they suffered from low curing speed and difficulty in curing at low temperatures.

Thiirane-containing resin wherein oxirane ring of the epoxy resin is replaced with thiirane ring exhibits higher reactivity and faster curing speed at low temperatures since thiirane ring has a reactivity higher than the oxirane ring because of the higher distortion of the thiirane ring compared to the oxirane ring. Such thiirane-containing resin also exhibits low temperature curability, good adhesion and reduced odor since the thiol group generated by the ring opening is a substituent having a high chemical reactivity.

Thiirane-containing resin, however, suffered from poor storage stability, and in particular, from poor storage stability at a high temperature, for example, at 60° C. because of the high chemical reactivity of the thiol group.

JP-A 10-130513 discloses a method for preventing alteration in quality of mercapto group (—SH)-containing polymer wherein a primary antioxidant such as an alkylphenol-based oxidant or an amine-based oxidant and a secondary antioxidant such as a sulfur-based antioxidant or a phosphorus-based antioxidant are simultaneously incorporated in the polymer to suppress the oxygen concentration of the gas phase part below the predetermined volume. However, incorporation in the thiirane-containing resin of an alkylphenol compound which is a versatile antioxidant proved to have no influence in improving the storage stability.

JP-A 5-132541, JP-A 5-230182 and the like disclose one-part epoxy resin compositions wherein the epoxy resin has a ketimine compound blended therewith as a latent curing agent. Ketimine compound, however, suffers from a drawback that amine which generates in the course of the hydrolysis (equilibrium) reaction in the presence of water contributes for the curing reaction and as a consequence, the curing proceeds at an extremely slow speed, and in particular, the resin does not cure at a low temperature, for example, at a temperature not more than 5° C.

On the other hand, a thiirane-containing resin wherein oxirane ring of an epoxy resin is replaced with thiirane ring exhibits high reactivity, and fast curing properties at low temperatures, since the ring of thiirane ring is more distorted than the oxirane ring. The thiirane-containing resin also exhibits excellent low temperature curability, good adhesion and reduced odor since the thiol group generated by the ring opening of the thiirane group is a substituent of high chemical reactivity. The high chemical reactivity of thiol group, however, sometimes results in reduced storage stability of the thiirane-containing resin as well as higher viscosity and susceptibility to crystallization of the thiirane-containing resin.

In addition to the high viscosity, the thiirane-containing resin also suffers from problems, namely, reduced workability by the viscosity increase in the prolonged storage, poor appearance by the clouding of the resin composition caused by crystallization, or even from poor workability by solidification.

When the thiirane-containing resin was blended with a reactive diluent such as a glycidyl ether compound to obviate the problems as described above, the thiirane-containing resin experienced rapid crystallization, and the problems of poor appearance and reduced workability could not be obviated.

In view of such situation, the objects of the present invention are:

to provide an adhesive composition which exhibits adhesive strength and fast curing properties higher than the conventional epoxy resin-based adhesives, and which is adapted for use as an adhesive for rubbers, metals, and plastics;

to provide an adhesive composition which exhibits well-balanced pot life and low temperature curability as well as good adhesion;

to provide an adhesive composition which exhibits adhesive strength, fast curing properties, and flexibility higher than the conventional epoxy resin-based adhesives as well as reduced odor, and which is adapted for use as an adhesive for civil engineering and construction purposes;

to provide a resin composition containing the resin of particular type which is adapted for use as a sealant and which exhibits improved adhesion and tensile strength;

to provide a resin composition adapted for used as a coating composition and a coating agent which exhibits excellent curability simultaneously with extended pot life, and higher adhesive strength to the substrate and less odor compared to the conventional epoxy resin-based adhesives;

to provide a resin composition for electric applications which is capable of developing electric insulation faster than the conventional resin compositions for electric applications as well as flame retardancy, which exhibits excellent curability and good adhesion to metals, and which is adapted for use as a potting resin for a print circuit board, a resin to be impregnated in a prepreg, and the like;

to provide a resin composition which exhibits satisfactory storage stability at high temperatures without detracting from the high curing speed;

to provide a resin composition which exhibits excellent adhesion and low temperature curability as well as reduced odor and satisfactory storage stability;

to provide a fast curing, one part resin composition which exhibits excellent low temperature curability and storage stability, and which is adapted for use as an adhesive adapted for use as a coating composition, adhesive, and the like;

to provide a resin composition wherein crystallization of the resin is suppressed to prevent clouding that adversely affect the outer appearance of the resin composition, and which has reduced viscosity.

DISCLOSURE OF THE INVENTION

In order to obviate the problems as described above, the present invention provides an adhesive composition containing compound (A) wherein all or a part of oxirane ring in an epoxy compound is replaced with thiirane ring (group) represented by the following formula (1):

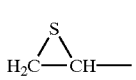

(1)

or the compound (A) and compound (B) which contains oxirane ring and no thiirane ring in the molecule; wherein the ratio of oxirane ring/thiirane ring (group) is from 90/10 to 10/90.

The present invention also provides an adhesive composition containing the compound (A) or the compounds (A) and (B), wherein said composition contains oxirane ring and thiirane ring at a ratio of oxirane ring/thiirane ring of 90/10 to 10/90; and wherein said composition further contains at least one curing agent selected from the group consisting of compounds containing hydroxyl group, mercapto group, amino group, carboxyl group or isocyanate group and compounds having acid anhydride structure.

The present invention also provides an adhesive composition wherein, when said curing agent is a compound containing amino group, at least one alicyclic polyamine compound is included in the composition.

The present invention also provides an adhesive composition wherein said composition further comprises a liquid curing agent having a viscosity at 25° C. of up to 100,000 mPa·s.

Viscosity at 25° C. of said compound (A) or said compounds (A) and (B) is preferably up to 100,000 mPa·s.

When content of thiirane (molar fraction (%) of thiirane ring in the total of oxirane ring and thiirane ring in the compound containing oxirane ring and/or thiirane ring) is x, and equivalent ratio of the curing agent to the total of oxirane ring and thiirane ring is y, x and y may preferably meet the following relations (1) and (2):
when $$10\% \leq x < 50\%,$$

$$y=(1-x/100)\pm 0.2 \quad (1),$$

and when $$50\% \leq x \leq 90\%,$$

$$0.1 \leq y \leq 0.7 \quad (2).$$

The present invention also provides a resin composition for a sealant containing at least one member selected from the group consisting of polysulfide resin, urethane resin, silicone resin, modified silicone resin and butyl rubber; and said adhesive composition.

The present invention also provides a resin composition for a sealant which further comprises 10 to 200 parts by weight of an inorganic filler and 10 to 200 parts by weight of a plasticizer per 100 parts by weight of said compound (A) or total of said compounds (A) and (B).

The present invention also provides a resin composition for a coating composition and a coating agent containing the compound (A) or the compounds (A) and (B), wherein said composition contains oxirane ring and thiirane ring at a ratio of oxirane ring/thiirane ring of 95/5 to 1/99, and wherein said composition further contains at least one curing agent selected from the group consisting of compounds containing hydroxyl group, mercapto group, amino group, or carboxyl group.

In said resin composition for a coating composition and a coating agent, when content of thiirane is x, and equivalent ratio of the curing agent to the total of oxirane ring and thiirane ring is y, x and y may preferably meet the following relations (1) and (2):
when $$5\% \leq x < 50\%,$$

$$y=(100-x)/100\pm 0.2 \quad (1),$$

and when $$50\% \leq x \leq 99\%,$$

$$0.1 \leq y \leq 0.7 \quad (2).$$

The resin composition may preferably further comprise 3 to 50 parts by weight of a filler for modification per 100 parts by weight of said compound (A) or total of said compounds (A) and (B).

The present invention also provides a resin composition for electric applications containing the compound (A), or the compound (A) and the compound (B); wherein said composition contains oxirane ring and thiirane ring at a ratio of oxirane ring/thiirane ring of 95/5 to 1/99; and wherein said composition further contains at least one curing agent selected from the group consisting of compounds containing hydroxyl group, mercapto group, amino group, or carboxyl group.

In the resin composition for electric application, when content of thiirane is x, and equivalent ratio of the curing agent to the total of oxirane ring and thiirane ring is y, x and y may preferably meet the following relations:
when $$5\% \leq x < 50\%,$$

$$y=(100-x)/100\pm 0.2 \quad (1),$$

and when $$50\% \leq x \leq 99\%,$$

$$0.1 \leq y \leq 0.7 \quad (2)$$

in view of the adhesion performance.

The resin composition may further comprise 2 to 30 parts by weight of a flame retardant per 100 parts by weight of said compound (A) or total of said compounds (A) and (B).

The present invention also provides a resin composition containing the compound (A) wherein said composition contains oxirane ring and thiirane ring at a ratio of oxirane ring/thiirane ring of 95/5 to 1/99, and has a moisture content of: 1000–10x (ppm) or less when x represents content (%) of thiirane.

The resin composition may preferably further comprise 1 to 100 parts by weight of a dehydrating agent per 100 parts by weight of the compound having oxirane ring and/or thiirane ring.

The resin composition may preferably further comprise at least one curing agent selected from the group consisting of compounds containing hydroxyl group, mercapto group, amino group, carboxyl group or isocyanate group and compounds having acid anhydride structure.

The present invention also provides a resin composition containing a resin component comprising the compound (A) or the compounds (A) and (B), and a phosphite ester compound; wherein said resin component contains oxirane ring and thiirane ring at a ratio of oxirane ring/thiirane ring of 95/5 to 1/99.

The resin composition may preferably contain said phosphite ester compound at a content of 0.1 to 30 parts by weight per 100 parts by weight of said resin component.

Said phosphite ester compound may preferably contain at least one member selected from the group consisting of phosphite ester compounds represented by the following structural formula (2) or (3):

$$R^1-O-P\begin{matrix}O-R^2\\O-R^3\end{matrix} \quad (2)$$

$$R^4-O-P\begin{matrix}O-\\O-\end{matrix}\begin{matrix}-O\\-O\end{matrix}P-O-R^5 \quad (3)$$

wherein $R^1$ to $R^5$ represent a hydrocarbon group containing up to 30 carbon atoms.

Said ester phosphite compound may preferably contain at least one member selected from the group consisting of phosphite ester compounds wherein at least one of $R^1$ to $R^3$ in the structural formula (2) is an aromatic ring and phosphite ester compounds wherein at least one of $R^4$ and $R^5$ in the structural formula (3) is an aromatic ring.

In said structural formula (2), the phosphite ester compounds wherein at least one of $R^1$ to $R^3$ is an aromatic ring is preferably a diarylmonoalkyl phosphite.

The resin composition may preferably further comprise at least one curing agent selected from the group consisting of compounds containing hydroxyl group, mercapto group, amino group, carboxyl group or isocyanate group and compounds having acid anhydride structure.

The present invention also provides a fast curing, one part resin composition containing a resin component containing oxirane ring and thiirane ring at a ratio of oxirane ring/thiirane ring of 95/5 to 1/99; and a ketimine compound.

Said ketimine compound is preferably the one synthesized from a compound containing primary amino group bonded to secondary or tertiary carbon and a ketone.

Said ketimine compound is preferably the one synthesized from a compound containing primary amino group bonded to primary carbon and a ketone having a substituent at α position.

The resin composition may preferably further comprise at least one member selected from the group consisting of phosphite ester compounds having the structural formula (2) or (3) at a content of 0.1 to 30 parts by weight per 100 parts by weight of said resin component.

The present invention also provides a resin composition containing a resin component comprising the compound (A) or the compounds (A) and (B), and a liquid glycidylamine compound; wherein weight ratio of said resin component to said liquid glycidylamine compound is 95/5 to 60/40.

Said liquid glycidylamine compound is preferably a liquid diglycidylamine compound.

The resin composition may preferably further comprise a phosphite ester compound at a content of 0.1 to 30 parts by weight per 100 parts by weight of said compound having at least one of oxirane ring and thiirane ring, and the phosphite compound is preferably the phosphite compounds having phenyl group and an alkyl group represented by the structural formula (2) or phosphite compounds having Spiro skeleton represented by the structural formula (3).

The resin composition may preferably further comprise at least one curing agent selected from the group consisting of compounds containing hydroxyl group, mercapto group, amino group, carboxyl group, isocyanate group, or imine group and compounds having acid anhydride structure.

Said compound (A) is preferably a compound wherein all or a part of oxirane ring in an epoxy compound of bisphenol F glycidyl ether type is replaced with thiirane ring represented by said structural formula (1).

Said compound (B) is preferably an epoxy resin which is a glycidyl ether of bisphenol F.

BEST MODE FOR CARRYING OUT THE INVENTION

Figure 1:
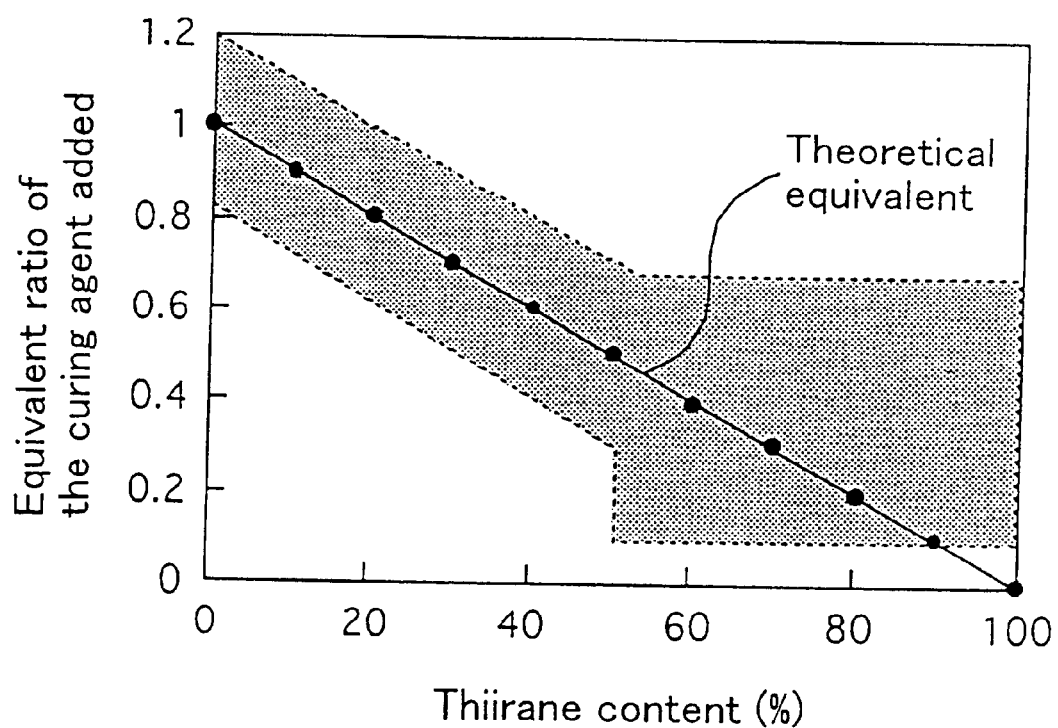
FIG. 1 is a graph showing equivalent ratio y of the curing agent to the total of oxirane ring and thiirane ring in relation to thiirane content x.

The present invention is hereinafter described in further detail.

The present invention relates to various resin compositions containing a resin component comprising either compound (A) wherein all or a part of oxirane ring in an epoxy compound is replaced with thiirane ring, or the compound (A) and compound (B) which contains oxirane ring and no thiirane ring. The present invention encompasses first to eighth aspects as described below.

First aspect: an adhesive composition containing the resin component as described above.

Second aspect: a composition for sealant containing the resin component as described above, and in addition, at least one member selected from the group consisting of polysulfide resin, urethane resin, silicone resin, modified silicone resin and butyl rubber, and optionally, an inorganic filler and a plasticizer.

Third aspect: a composition for a coating composition and a coating agent containing the resin component as described above, and preferably, a filler for modification.

Fourth aspect: a composition for electric applications containing the resin component as described above, and preferably, a flame retardant.

Fifth aspect: a composition contain g the resin component as described above which has a moisture content not exceeding the predetermined value, and preferably, a dehydrating agent.

Sixth aspect: a resin composition having improved storage stability containing the resin component as described above and a phosphite ester compound.

Seventh aspect: a fast curing, one part resin composition containing the resin component as described above and a ketimine.

Eighth aspect: a resin composition containing the resin component as described above and a liquid glycidylamine compound.

[1] Typical Components Included in the Various Resin Compositions of the Present Invention The present invention provides various resin compositions which basically contain a resin component comprising either compound (A) wherein all or a part of oxirane ring in an epoxy compound is replaced with thiirane ring, or the compound (A) and compound (B) which contains oxirane ring and no thiirane ring.

<1> Compound (A)

The resin compositions of the present invention (hereinafter simply referred to as the present compositions) contain compound (A) as a main component. Component A is a compound wherein all or a part of oxirane ring in an epoxy compound is replaced with thiirane ring. The compound (A) may be either a compound (A-1) wherein the oxirane ring in the molecule has been entirely replaced with thiirane ring so that the molecule includes only the thiirane ring; or a compound (A-2) wherein the oxirane ring in the molecule has been only partly replaced with thiirane ring so that the molecule includes both the thiirane ring and the oxirane ring.

Exemplary epoxy compounds used in the production of the compound (A) include the compounds represented by the following structural formula (a), (b), (c), (d), (e), or (f):

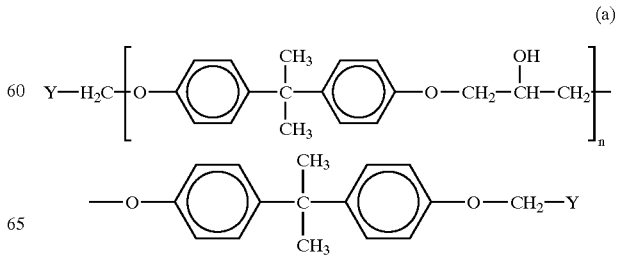

-continued (b)
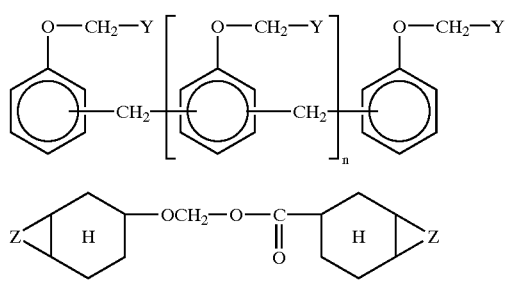

(c)
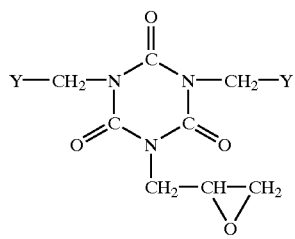

wherein Z is O or S, (d)
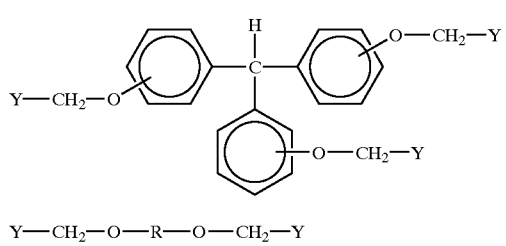

(e)

Y—CH₂—O—R—O—CH₂—Y wherein all of the substituent Y is oxirane ring represented by the structural formula (4):

(4)

or Z is oxygen atom. In the formulae, n represents a number which is either 0 or more than 0.

The exemplary epoxy compounds also include those wherein the hydrogen atom or other substituent is replaced with a halogen atom, for example, those represented by the following structural formula (g):

(g)
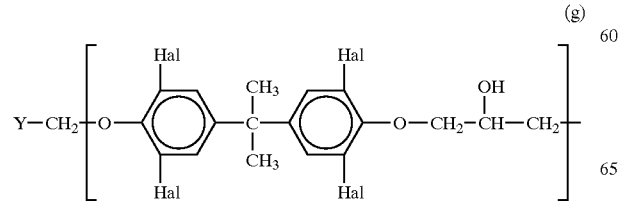

-continued

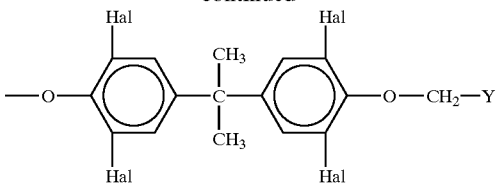

wherein Hal represents a halogen atom. Exemplary halogen atoms include bromine, chlorine, and fluorine.

In the present invention, the compound (A) is a compound wherein at least one of the two or more Y in the structural formula (a), (b), (c), (d), (e), (f), or (g) is thiirane ring represented by the structural formula (1) and the Y which is not the thiirane ring is oxirane ring represented by the structural formula (4); or at least one of Z is S and other Z is O.

Examples of such compound (A) are those represented by the following structural formulae. In each of the following structural formulae, at least one of the two or more Y is thiirane ring represented by the structural formula (1) and the Y which is not the thiirane ring is oxirane ring represented by the structural formula (4), or at least one of Z is S and other Z is O; and n presents a number which is either 0 or more than 0.

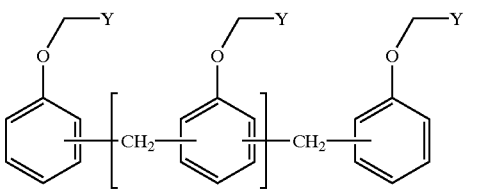

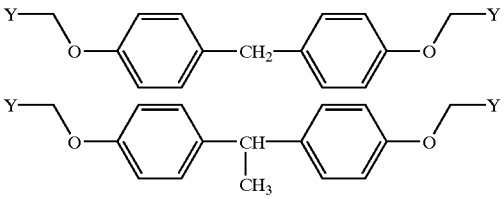

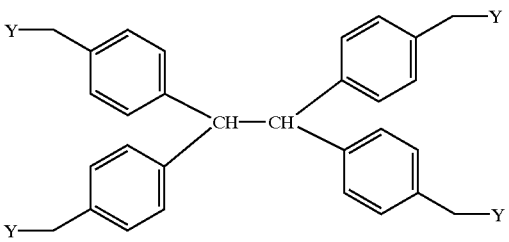

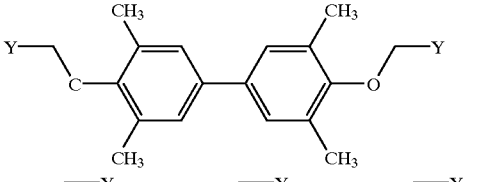

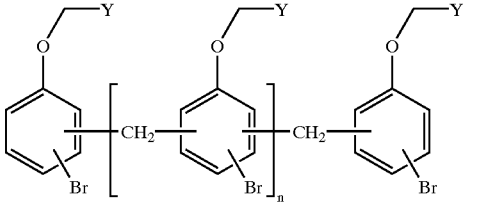

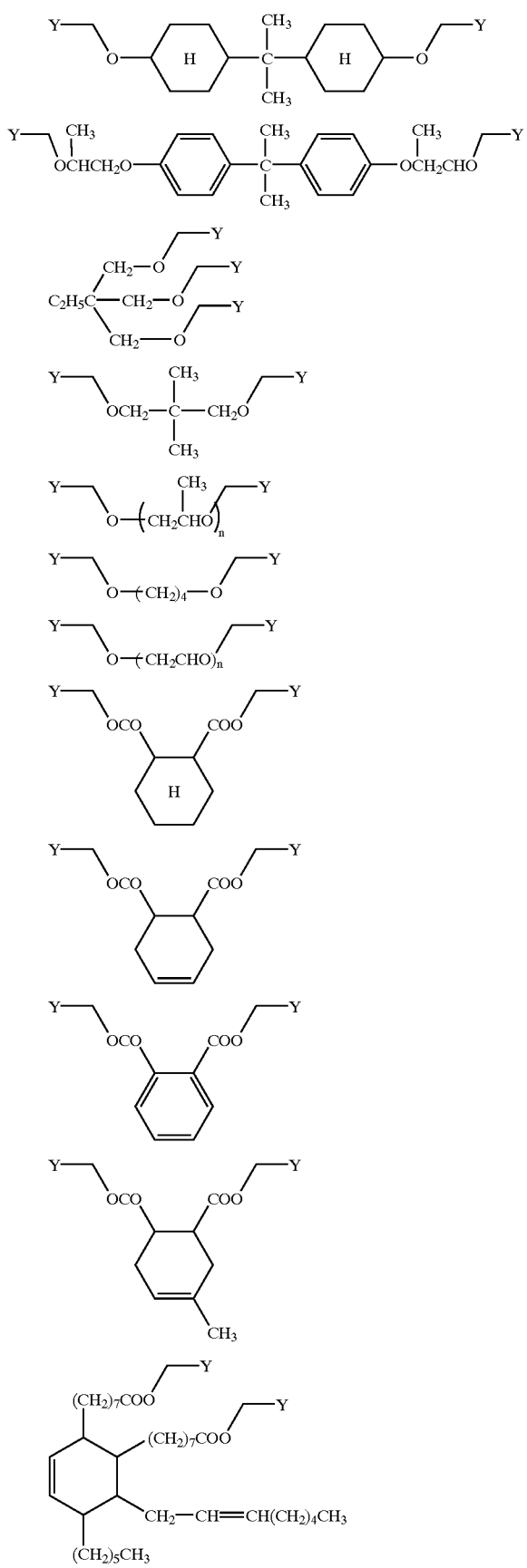

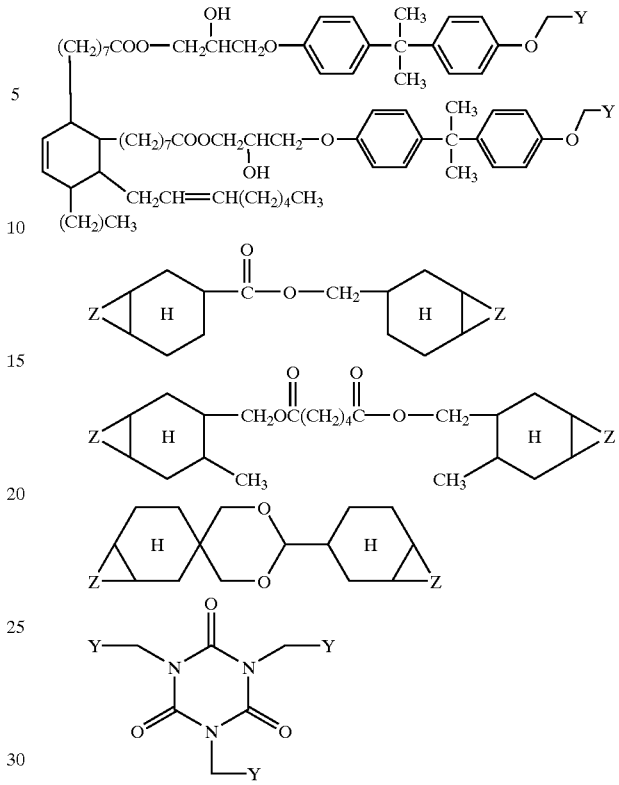

Alternatively, the compound (A) used may be a compound wherein at least one of the two or more Y in the glycidylamine compound represented by any of the following structural formulae is thiirane ring represented by the structural formula (1) and the Y which is not the thiirane ring is oxirane ring represented by the structural formula (4).

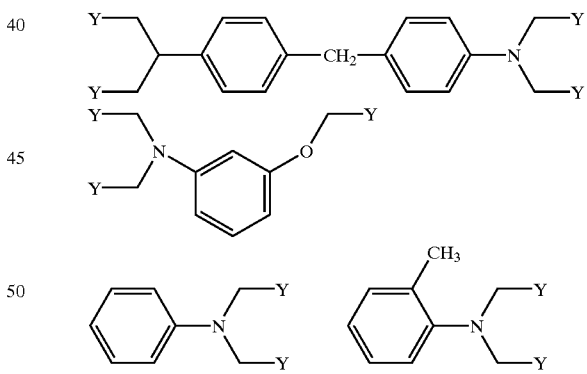

Such compound (A) may be produced by the procedure wherein the epoxy compound as described above is reacted with an episulfidating agent in a polar solvent under strong agitation.

The episulfidating agent used may be, for example, potassium thiocyanate (KSCN) or thiourea.

The polar solvent used may be, for example, methanol, ethanol, acetone, water, or a solvent prepared by mixing such polar solvents. When the episulfidating agent used is KSCN, and the compound (A) with 50% thiirane replacement, namely, with the ratio of oxirane ring content/thiirane ring content of 1/1 is to be produced, use of a 2/1 water/ethanol mixed solvent is preferable. When the compound (A) with 100% thiirane replacement, namely, with the ratio of oxirane ring content/thiirane ring content of 0/100 is to be produced, use of acetone for the solvent is preferable.

The reaction is generally conducted at a temperature in the range of 10 to 35° C., for example, at a room temperature for approximately 10 to 40 hours, for example, for about 20 hours in a reaction atmosphere which may be air or an inert atmosphere such as nitrogen.

A typical production procedure of the compound (A) is production of the compound (A) having thiirane ring by using a bisphenol A epoxy resin for the starting material. Such production may be accomplished by the procedure represented by the reaction scheme as shown below wherein x represents S or O.

The compound (A) or the compound (B) which has a viscosity at 25° C. of up to 100,000 mPa·s as described above is preferably a compound having an equivalent of up to 450 g/eq, or a mixture of compounds having an average equivalent of up to 450 g/eq calculated in terms of the epoxy compound before the replacement with the thiirane ring. Among these, the most preferred are epoxy resins which are a bisphenol A glycidyl ether or a bisphenol F glycidyl ether having an epoxy equivalent in the range of 150 to 300.

<3> Moisture Content of the Resin

The moisture content (ppm) of the present composition (ratio of the moisture weight in relation to the total weight of the composition) is preferably adjusted to a range of value which reduces in inverse proportion to the thiirane content

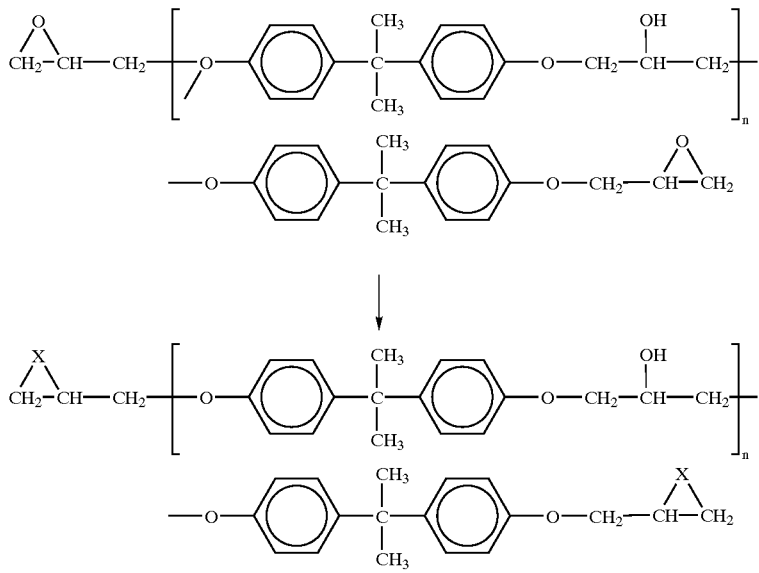

<2> Compound (B)

All of the epoxy compounds indicated above as the exemplary epoxy compounds which may be used for the production of the compound (A) can be used as the compound (B) which has oxirane ring and no thiirane ring in the molecule included in the present composition. Examples of such compound (B) are those which are represented by any one of the above-described formulae and wherein Y is oxirane ring represented by the formula (4), or Z is O with no exception; and n represents a number which is either 0 or more than 0.

Among the epoxy compounds employed in producing the compound (A) or (B), bifunctional epoxy compounds which have two oxirane rings in the molecule are preferable since the resulting composition of the present invention exhibits good adhesion, and more specifically, aromatic bifunctional epoxy compounds which have two oxirane rings in the molecule are preferable in view of the excellent adhesion. Bisphenol F epoxy compounds are particularly preferable in view of the low viscosity, and hence, favorable handling convenience.

In the composition according to any one of the first to the eighth aspect of the present invention, use of the compound (A) or the compounds (A) and (B) which is liquid and which has a viscosity at 25° C. of up to 100,000 mPa·s, and in particular, up to 30,000 mPa·s is preferable because the resulting composition of the present invention exhibits fast curing at room temperature.

(%) of the present composition in accordance with the following relation (3):

$$\text{(moisture content of the present composition)} \leq 1000 - 10x \text{ (ppm)} \quad (3)$$

In the relation as described above, x represents thiirane content (%) in the present composition. The thiirane content is molar fraction (%) of thiirane ring in the total of oxirane ring and thiirane ring in the compound containing the oxirane ring and/or the thiirane ring, namely the compound (A) or the compounds (A) and (B).

Moisture in the epoxy resin is generally removed in the step of toluene removal in the production of the epoxy resin. An epoxy resin, however, has hydroxyl group and ether group within is molecule, and as a consequence, the epoxy resin generally suffers from high hygroscopicity. In the case of a general-purpose bisphenol A resin, it has been observed that the moisture content should be suppressed to approximately 1000 ppm in order to maintain the storage stability to an acceptable level. However, in the case of the present composition containing the oxirane ring and the thiirane ring at the ratio as described above, the storage stability can not be maintained at an acceptable level when the moisture content is at the level equivalent to such epoxy resin, and in particular, it has been quite difficult to maintain the storage stability at a high temperature (approximately 60° C. or higher) at an acceptable level since the thiirane ring is a group having a reactivity higher than that of the oxirane ring and the thiirane ring is more susceptible to opening by the moisture. In addition, the thiol group generated by the ring opening is a group having an acidity higher than that of the hydroxyl group, and this accelerates autopolymerization between the thiol group and the thiirane ring to invite increase in the viscosity. In view of such situation, it has been deduced that the reduction in the moisture content should be preferable for maintaining the storage stability at an acceptable level.

In the present composition, the storage stability of the composition can be maintained at an acceptable level when the moisture content (ppm) is adjusted to a value less than 1000 ppm which reduces in inverse proportion to the thiirane content at a predetermined rate in accordance with the relation (3) as described above.

More specifically, when the thiirane content is up to 60%, the moisture content of the present composition is preferably reduced to the level of up to 400 ppm in order to maintain the storage stability to an acceptable level.

<4> Dehydrating Agent

In the composition of the present invention, incorporation of a dehydrating agent is effective for attaining the low moisture content of the composition. Exemplary methods that may be employed for reducing the moisture content other than such incorporation of the dehydrating agent are azeotropy with toluene of the present composition at the final stage of its production, and incorporation of an antihydrolytic agent in the composition of the present invention.

The dehydrating agents which may be employed in the present invention include both inorganic (mineral) dehydrating agents and organic dehydrating agents.

The inorganic (mineral) dehydrating agent may be any of those which are generally used as a desiccant, for example, silica gel, magnesia, alumina, molecular sieve, bentonite, montmorillonite, calcium carbonate, and silica.

Exemplary organic dehydrating agents include vinylsilane; aluminum isopropylate, aluminum sec-butylate, tetraisopropyl titanate, tetra-n-butyl titanate, zirconium-2-propylate, zirconium-n-butylate, ethyl silicate, and other metal alkoxides; methyl o-formate, ethyl o-formate, dimethoxypropane, and other organoalkoxy compounds; methylisocyanate, ethylisocyanate, propylisocyanate, and other monofunctional isocyanates.

The dehydrating agent as described above may be used either alone or in combination of two or more, and it is also possible to use an inorganic dehydrating agent and an organic dehydrating agent at the same time.

<5> Curing Agent

The composition according to the first to the eighth aspects of the present invention may be produced as a two part composition wherein the resin component as described above and the curing agent are separately produced for subsequent mixing at a predetermined mixing ratio before its use. Alternatively, the composition of the present invention may be produced as a one part composition wherein the resin component as described above is mixed with a latent curing agent that exerts curing action by application of heat or pressure to the composition.

The curing agent used in the composition of the present invention may be the one which is used as the curing agent for an epoxy resin adhesive, for example, those having hydroxyl group, mercapto group, amino group, carboxyl group, or isocyanate group and those having acid anhydride structure. Examples of such curing agent are amine curing agents, acid or acid anhydride curing agents, basic active hydrogen-containing compounds, imidazoles, polymercaptane curing agents, phenol resins, urea resins, melamine resins, isocyanate curing agents, latent curing agents, and UV curing agents.

The type of the curing agent used, however, differs by the aspect of the present invention.

Examples of the amine curing agent include ethylenediamine, diethylenetriamine, triethylenetetramine, tetraethylenepentamine, hexamethylenediamine, iminobispropylamine, bis (hexamethylene)triamine, 1,3,6-trisaminomethylhexane, and other polyamines; trimethylhexamethylenediamine, polyetherdiamine, diethylaminopropylamine and other polymethylenediamines; menthenediamine (MDA), isophoronediamine (IPDA), bis (4-amino-3-methylcyclohexyl)methane, N-aminoethylpiperadine (N-AEP), diaminodicyclohexylmethane, bisaminomethylcyclohexane, 3,9-bis(3-aminopropyl)-2,4,8,10-tetraoxaspiro(5.5) undecane, and other cycloaliphatic polyamines; methaxylilenediamine and other aliphatic polyamines including an aromatic group; m-phenylenediamine, diaminodiphenylmethane, diaminodiphenylsulfone, diaminodiethyldiphenylmethane and other aromatic polyamines; and 3,9-bis(3-aminopropyl)-2,4,8,10-tetraspiro[5.5] undecane. Other examples are amine adduct (polyamine epoxy resin adduct), polyamine-ethylene oxide adduct, polyamine-propylene oxide adduct, cyanoethylated polyamine, or ketimine compounds which are the reaction product between polyamine and a ketone; straight-chain diamine, tetramethylguanidine, triethanol amine, piperidine, pyridine, benzyldimethylamine,picoline, 2-(dimethylaminomethyl)phenol, dimethylcyclohexylamine, dimethylbenzylamine, dimethyl hexylamine, dimethylaminophenol, dimethylamino p-cresol, N,N'-dimethylpiperadine, piperidine, 1,4-diazadicyclo(2,2,2)octane, 2,4,6-tris(dimethylaminomethyl) phenol, 1.8-diazabicyclo(5,4,0)undecene-1, and other secondary and tertiary amines; liquid polyamides produced by reacting a dimeric acid with a polyamine such as diethylenetriamine or triethylenetetramine.

Among these, incorporation as a curing agent of at least one alicyclic polyamine compound enables production of the composition exhibiting prolonged pot life, high curing speed at a low temperature, and good balance between the pot life and the curing time at a low temperature. The alicyclic polyamine compound may be used either in combination with other amine curing agent or alone.

Exemplary alicyclic polyamine compounds include menthene diamine (MDA), isophoronediamine (IPDA), bis(4-amino-3-methylcyclohexyl)methane, N-aminoethylpiperadine (N-AEP), and the like as well as modified products thereof such as 3-aminomethyl-3,5,5-trimethylcyclohexylamine bisphenol A diglycidyl ether adduct.

Exemplary acid curing agents include adipic acid, azelaic acid, decanedicarboxylic acid and other polycarboxylic acids.

Exemplary acid anhydride curing agents include phthalic anhydride, trimelitic anhydride, ethylene glycol bis (anhydrotrimellitate), glycerol tris (anhydrotrimellitate), pyromellitic anhydride, 3,3',4,4'-benzophenone tetracarboxylic anhydride and other aromatic acid anhydrides; maleic anhydride, succinic anhydride, tetrahydrophthalic anhydride, methyltetrahydrophthalic anhydride, methylnadic anhydride, alkenylsuccinic anhydride, hexahydrophthalic anhydride, methylhexahydrophthalic anhydride, methylcyclohexenetetracarboxylic anhydride, methylhymic anhydride, trialkyltetrahydrophthalic anhydride, poly (phenylhexadecanoic diacid)anhydride and other alicyclic acid anhydrides; polyadipic anhydride, polyazelaic anhydride, polysebacic anhydride, dodecenylsuccinic anhydride, poly(ethylocatadecanoic diacid)anhydride and other aliphatic acid anhydrides; and chlorendic anhydride, tetrabromophthalic anhydride, het anhydride and other halogenated acid anhydrides.

Exemplary basic active hydrogen-containing compounds include dicyanediamide, and dihydrazide of an organic acid.

Exemplary imidazoles include 2-methylimidazole, 2-ethyl-4-methylimidazole, 2-undecylimidazole, 2-heptadecylimidazole, 2-phenylimidazole, 1-benzyl-2-methylimidazole, 1-cyanoethyl-2-methylimidazole, 1-cyanoethyl-2-ethyl-4-methylimidazole, 2-methylimidazolium-isocyanurate, 2,4-diamino-6-[2-methylimidazoline-(1)]-ethyl-S-triazine, and 2,4-diamino-6-[2-ethyl-4-methylimidazoline-(1)]-ethyl-S-triazine.

Exemplary polymercaptane curing agents include partial epoxy adduct of 2,2'-bismercaptoethylether; pentaerythritol tetrathioglycolate, dipentaerythritol hexathioglycolate, trimethylol propane trithioglycolate and other thioglycolates; polysulfide rubber having mercapto group at the terminal and other compounds that have mercapto group.

Exemplary isocyanate curing agents include toluene diisocyanate, hexamethylene diisocyanate, xylene diisocyanate, and other isocyanate compounds; and blocked isocyanate compounds wherein the isocyanate group is masked by the reaction with phenol, alcohol, caprolactam or the like.

The composition of the present invention may be also produced as a one part composition wherein the resin component as described above is mixed with a latent curing agent that exerts curing action by application of heat or pressure to the composition. Exemplary latent curing agents which may be used for the preparation of the one part composition include a boron trifluoride-amine complex which is a compound of an amine such as n-hexylamine, monoethylamine, benzylamine, diethylamine, piperidine, triethylamine, or aniline with boron trifluoride; dicyanediamide and derivatives of dicyanediamide such as o-tolylbiguanide, α-2,5-dimethylbiguanide, α,ω-diphenylbiguanide, and 5-hydroxynaphthyl-1-biguanide; acid hydrazides such as succinic hydrazide, adipic acid hydrazide, isophthalic hydrazide, p-oxybenzoic hydrazide, salicilic hydrazide, and phenylaminopropionic hydrazide; diaminomaleionitrile and derivatives thereof; melamine derivatives such as diallylmelamine; amineimides synthesized from a carbonate, dimethylhydrazine, and an epoxy compound; a salt of diamine such as ethylenediamine, hexamethylenediamine, or piperidine with an aliphatic dicarboxylic acid such as sebacic acid; a salt of a polyamine such as 2,4,4-trimethyl-2,4,7-trihydroxyflavan with a polyhydroxyphenol such as N,N'-dimethyl-1,3-propanediamine; phenylphosphonate of a polyamine and phenylphosphate of a polyamine; and an ester compound of sulfonic acid and a primary alcohol, phosphoric acid monoester or diester, or a mixture thereof, and an ester compound produced by addition reaction of sulfonic acid and an epoxy compound. Also included are UV curing agents such as an aromatic diazonium salt and an aromatic sulfonium salt.

The curing agent used for the curing of the present composition is blended at amount in an equivalent ratio to the total of the thiirane ring and the oxirane ring of from 0.1 to 1.5. When the curing agent is used at an amount less than 0.1 in equivalent ratio to the total of the thiirane ring and the oxirane ring, the resulting composition becomes uncurable. On the other hand, when the curing agent is used at an amount in excess of 1.5 in equivalent ratio, the cured product will be brittle. It should be noted that the preferable content of the curing agent is different from the above-described range when the curing agent used is the ketimine compound as described below.

When an adhesive composition having a satisfactory low temperature curability in an environment of, for example, 0° C. is to be produced without sacrificing the pot life, use of an alicyclic polyamine compound is preferable. In such a case, the alicyclic polyamine compound may be either blended as the only curing agent or together with other curing agents. When the alicyclic polyamine compound is used with other curing agents, the proportion of the alicyclic polyamine compound in the curing agent is preferably in the range of 30 to 90% by mole.

When a liquid curing agent having a viscosity at 25° C. of up to 100000 mPa·s, and preferably up to 30000 mPa·s is used in the composition of the present invention, the resulting composition will exhibit fast curing properties at room temperature.

Exemplary curing agents having a viscosity at 25° C. of up to 30000 mPa·s include ethylenediamines such as triethylenetetramine and tetraethylenepentamine; heterocyclic reagents such as 1-(2-aminoethyl)piperadine; m-xylilenediamines; and also, polyamide amines and polythiols.

When content of thiirane is x, and equivalent ratio of the curing agent to the total of oxirane ring and thiirane ring is y, x and y may preferably meet the following relations (1) and (2):
when $x<50\%$, $y=(1-x/100)\pm 0.2$ (1), and when $50\%\leq X$, $0.1\leq y\leq 0.7$ (2).

FIG. 1 is a graph showing y in relation to x. In FIG. 1, the hatched area is the preferable area of x and y.

When the curing agent is used at at equivalent ratio greater than the range as specified above, cost of the raw materials will be excessively high since conventional curing agents are generally expensive. When the curing agent is used at an equivalent ratio smaller than the range as specified above, curing reaction will not be sufficiently promoted and the composition will suffer from insufficient curing and insufficient adhesion.

The thiirane ring present in the composition of the present invention has high chemical reactivity, and the —SH generated by the ring opening of the thiirane ring contributes for the curing. As a consequence, the curability of the composition is maintained at an acceptable level even when the curing agent is used at an amount smaller than the amount of the curing agent used in the case of the compound containing only the oxirane ring by the amount corresponding to the contribution of the thiirane ring.

However, the reactivity saturates by an unknown mechanism when x is in the range of $50\%\leq x$, and the equivalent ratio of the curing agent used is not limited to the value given the by the relation: $y=(1-x/100)\pm 0.2$, and the curing reaction will be promoted at an acceptable level when y is in the range of $0.1\leq y\leq 0.7$.

However, it is more preferable that y is given by the relation: $y=(1-x/100)-0.1$ in view of the adhesion.

<6> Ketimine Compound

Of the amine curing agents as described above, ketimine compound is a compound which can be synthesized from a ketone and a polyamine.

Ketimine compounds cure quite slowly when they are mixed with an epoxy resin. However, when they are made in the form of a coating film or the like, the compound cures at room temperature by absorbing the moisture in the air and regenerating the amine by hydrolysis (equilibrium reaction) In view of such nature, ketimine compounds have been used as a latent curing agent for an epoxy resin. The epoxy resin containing the ketimine compound as the latent curing agent, however, suffered from the drawback of an extremely slow curing.

When a ketimine compound is blended with the resin component of the present invention containing the thiirane ring (hereinafter also referred as the thiirane-containing resin), the composition exhibits high curing speed as well as excellent curability at a low temperature (for example, at a temperature of not higher than 5° C., or at 0° C.). It is estimated that such good curability is realized by the high reactivity of the thiirane ring, and the likeliness of the thiirane-containing resin to undergo immediate reaction of with the amine. When the ketimine compound is blended with the thiirane-containing resin, the thiirane-containing resin rapidly consumes the amine regenerated from the ketimine compound and the hydrolysis of the ketimine compound is simultaneously accelerated, and it is estimated that the unique fast curing properties and low temperature curability are realized by such mechanism. Since the ketimine compound is a liquid exhibiting low viscosity, incorporation of the ketimine in the thiirane-containing resin having a high viscosity and a high susceptibility to crystallization results in the prevention of the crystallization of the thiirane-containing resin as well as decrease in the viscosity.

Examples of the polyamine which is used for the synthesis of the ketimine compound include aliphatic polyamines such as ethylenediamine, propylenediamine, butylenediamine, diethylenetriamine, triethylenetetramine, tetraethylenepentamine, pentaethylenehexamine, hexamethylenediamine, trimethylhexamethylenediamine, 1,2-propanediamine, iminobispropylamine, methyliminobispropylamine, MPMD manufactured by DuPont Japan, and metaxylenediamine; monoamines having ether bond in their backbone such as N-aminopiperadine and 3-butoxyisopropylamine and diamine having polyether skeleton as in the case of Jeffamine EDR184 manufactured by Sun Technochemical; alicyclic polyamines such as isophoronediamine, 1,3-bisaminomethylcyclohexane, 1-cyclohexylamino-3-aminopropane, and 3-aminomethyl-3, 3,5-trimethyl-cyclohexylamine; a diamine having norbornane skeleton as in the case of NBDA manufactured by Mitsui Chemical; a polyamide amine having amino group in the terminal of the molecule; and 2,5-dimethyl-2,5-hexamethylenediamine, menthene diamine, 1,4-bis(2-amino-2-methylpropyl)piperadine, and Jeffamine D230 and Jeffamine D400 manufactured by Sun Technochemical which has polypropylene glycol (PPG) for their skeleton.

Examples of the ketone include methyl ethyl ketone (MEK), isobutyl methyl ketone (MIBK), methyl isopropyl ketone (MIPK), and methyl t-butyl ketone (MTBK).

Of the ketimine compound as described above, the most preferred are ketimine compounds synthesized from a compound containing primary amino group which is bonded to the secondary or tertiary carbon and a ketone. In the case of such ketimine compound, a bulky substituent is present near the amino group generated by the hydrolysis of the ketimine compound, and the nucleophilicicy of the amino group is thereby suppressed. As a consequence, the composition of the present invention containing the ketimine as the latent curing agent exhibits excellent storage stability.

Examples of the compound containing, primary amino group which is bonded to the secondary or tertiary carbon include isophoronediamine, the menthene diamine represented by the following structural formula:

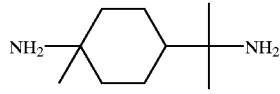

2,5-dimethyl-2,5-hexamethylenediamine, 1,4-bis(2-amino-2-methylpropyl)piperadine, and Jeffamine D230 and Jeffamine D400 manufactured by Sun Technochemical having a polypropylene glycol (PPG) skeleton. Examples of the ketone are the ketones as described above.

Preferable examples of the ketimine compound synthesized from the compound containing primary amino group which is bonded to the secondary or tertiary carbon and the ketone are ketimine compounds synthesized by combining any one of the amino group-containing compound with any one of the ketone as described above. Among such ketimine compounds, those synthesized from the ketone as described above and the isophoronediamine or the menthene diamine exhibits particularly good balance between the curing speed and the storage stability, and in particular, excellent storage stability.

Exemplary such ketimine compounds are the one produced from isophoronediamine and MIBK, and the one produced from menthene diamine and MIBK.

Of the ketimine compound as described above, also preferred are ketimine compounds synthesized from a compound containing primary amino group which is bonded to the primary carbon and a ketone having a substituent at α position. In the case of such ketimine compound, a bulky substituent is present near the double bond of the ketimine group, and the reaction between the imine and the thiirane ring or the oxirane ring is suppressed by this substituent to result in the reduced susceptibility to hydrolysis of the ketimine compound. As a consequence, storage stability in the absence of water is improved.

The amino group-containing compound having a primary amino group bonded to the primary carbon atom is a compound which has at least one amino group having methylene group at its α position, and exemplary such compounds include aliphatic polyamines such as ethylenediamine, propylenediamine, butylenediamine, diethylenetriamine, triethylenetetramine, tetraethylenepentamine, pentaethylenehexamine, hexamethylenediamine, trimethylhexamethylenediamine, 1,2-propanediamine, iminobispropylamine, methyliminobispropylamine, MPMD manufactured by DuPont Japan, and metaxylenediamine; monoamines having ether bond in their backbone such as N-aminoethylpiperadine and 3-butoxyisopropylamine and diamine having polyether skeleton as in the case of Jeffamine EDR184 manufactured by Sun Technochemical; alicyclic polyamines such as isophoronediamine, 1,3-bisaminomethylcyclohexane, 1-cyclohexylamino-3-aminopropane, and 3-aminomethyl-3,3,5-trimethyl-cyclohexylamine; a diamine having norbornane skeleton as in the case of NBDA manufactured by Mitsui Chemical; and a polyamide amine having amino group in the terminal of the molecule.

Among these, the preferred are metaxylylenediamine (MXDA), 1,3-bisaminomethylcyclohexane, and norbornane diamine (NBDA) in view of the good storage stability as well as remarkably excellent curability of the composition of the present invention containing the ketimine compound synthesized by using such compounds.

The ketone having a substituent at α position is a ketone having a substituent at α position counted from the carbonyl group, and exemplary such ketones include methyl t-butyl ketone, diisopropyl ketone, and methyl isopropyl ketone as well as propiophenone and benzophenone. Among these, the most preferred are methyl isopropyl ketone and methyl t-butyl ketone in view of the good balance between the storage stability and the curability of the blend of the ketimine compound synthesized from these substances and the epoxy resin.

The ketimine compound synthesized from the compound containing primary amino group bonded to the primary carbon atom and the ketone having a substituent at α position is preferably a ketimine compound produced by combining any one of the amino group-containing compound as described above with any one of the ketone as described above, and among these, the ketimine compounds synthesized from an amino group-containing compound and methyl isopropyl ketone or methyl t-butyl ketone exhibit particularly good balance between the curing speed and storage stability. The ketimine compounds synthesized from the ketone as described above and 1,3-bisaminomethylcyclohexane, norbornanediamine, or methaxylilenediamine also exhibit good balance between the curing speed and the storage stability, and in particular, excellent curability.

Exemplary such compounds include the one produced from 1,3-bisaminomethylcyclohexane and methyl t-butyl ketone; the one produced from NBDA manufactured by Mitsui Chemical. and methyl isopropyl ketone; the one produced from 1,3-bisaminomethylcyclohexane and methyl isopropyl ketone; the one produced from NBDA and methyl t-butyl ketone; the one produced from MXDA manufactured by Mitsubishi Gas Chemical Co. Inc. and methyl isopropyl ketone; and the one produced from MXDA manufactured by Mitsubishi Gas Chemical Co. Inc. and methyl t-butyl ketone.

Among these, those produced from NBDA manufactured by Mitsui Chemical. and methyl isopropyl ketone; NBDA and methyl t-butyl ketone; 1,3-bisaminomethylcyclohexane and methyl isopropyl ketone; and 1,3-bisaminomethylcyclohexane and methyl t-butyl ketone are excellent in their curability.

The ketimine compound as described above may be produced by reacting the ketone and the amine group-containing compound through heating under reflux in the absence of the solvent or in the presence of benzene, toluene, xylene or other solvent, and azeotropically removing the separated water.

It should be noted that, in the present invention, an aldimine synthesized from an aldehyde and an amine can be employed instead of the ketimine compound synthesized from the ketone and the amine as described above in a manner equivalent to the case of the ketimine compound.

In the composition of the present invention, the ketimine compound is preferably blended at a content in equivalent ratio of (imino group of the ketimine compound)/(oxirane ring and thiirane ring in the present resin component) of 0.1 to 2.0, and more preferably 0.3 to 1.5 since the content within such range results in an improved storage stability as well as improved curability of the resulting composition.

<7> Curing Accelerator

The composition of the present invention may further comprise a curing accelerator in addition to the curing agent as described above. Typical curing accelerators are a phenol and a tertiary amine.

Exemplary tertiary amines include benzylmethylamine, triethylamine, dimethylaminomethylphenol, trisdimethylaminomethylphenol, and 1,8-diazabicyclo [5.4.0]undecene-1,1,4-diazabicyclo[2.2.2]octane.

<8> Phosphite Ester Compound

In the case of thiirane-containing resin, thiol group generated by ring opening of the thiirane ring by moisture is a group having a high reactivity, and this invites autopolymerization between the thiol group and the thiirane ring. As a consequence, the composition containing the thiirane-containing resin suffers from the problem of insufficient storage stability despite the excellent low temperature curability and the good adhesion.

The composition of the present invention can contain a phosphite ester compound in addition to the thiirane-containing resin. When the composition of the present invention containing the phosphite ester compound simultaneously with the thiirane-containing resin is compared with a composition containing the thiirane-containing resin but no phosphite ester compound, the composition containing both the thiirane-containing resin and the phosphite ester compound exhibits markedly improved storage stability with the low temperature curability and the adhesion maintained at the equivalent level. Among the phosphite ester compounds, use of those having a structure with reduced steric hindrance around the phosphorus atom is effective in improving the storage stability since the interaction between phosphorus atom in the phosphite ester compound and sulfur atom in the thiol group generated by the ring opening of the thiirane ring results in the stabilization of the thiol group, and in turn, in the suppression of the autopolymerization of the thiol group and the thiirane ring. It is estimated that the storage stability of the thiirane-containing resin is thereby improved.

In addition, the phosphite ester compound is a liquid compound having a low viscosity. On the other hand, thiirane-containing resin has a viscosity higher than the epoxy resin which has oxirane ring instead of the thiirane ring. As a consequence, addition to the thiirane-containing resin of the phosphite ester compound results in the reduction in the viscosity the composition containing the thiirane-containing resin and improved workability.

The phosphite ester compound used in the present invention may be selected from various compounds which are esters of phosphonic acid, and preferably, the phosphite ester compound is at least one phosphite ester compound selected from the group consisting of the phosphite ester compounds represented by the following structural formulae (2) and (3):

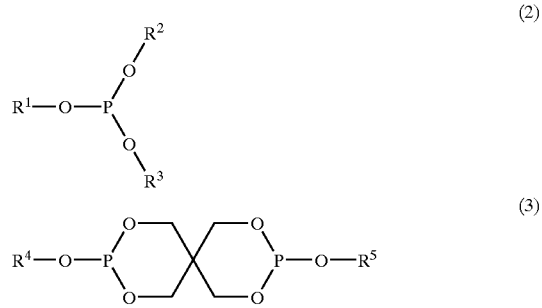

wherein $R^1$ to $R^5$ are a hydrocarbon group having up to 30 carbon atoms.

Exemplary compounds represented by the structural formula (2) include triphenyl phosphite, tris(nonylphenyl)

phossphite, triethyl phosphite, tridecyl phosphite, tris(tridecyl)phosphite, diphenylmono(2-ethylhexyl)phossphite, diphenylmonodecyl phosphite, diphenylmono(tridecyl)phossphite, dilauryl hydrogen phosphite, dioleyl hydrogen phosphite, diphenyl hydrogen phosphite, tetraphenyldipropyleneglycol diphosphite, tetraphenyltetra(tridecyl)pentaerythritol tetraphosphite, tetraphenyltetra(tridecyl)pentaerythritol tetraphosphite, tetra(tridecyl)-4,4'-isopropylidene diphenyl diphosphite, trilauryl trithiophosphite, tristearyl phosphite, and tris(2,4-di-t-butylphenyl)phossphite; and preferable exemplary compounds represented by the structural formula (2) include triphenyl phosphite, tris(nonylphenyl)phossphite, triethyl phosphate, tridecyl phosphite, tris(tridecyl)phossphite, diphenylmono(2-ethylhexyl)phossphite, diphenylmonodecyl phosphite, diphenylmono(tridecyl)phossphite, and tristearyl phosphite; and exemplary compounds represented by the structural formula (3) include bis(tridecyl)pentaerythritol diphosphite, bis(nonylphenyl)pentaerythritol diphosphite, distearylpentaerythritol diphosphite, hydrogenated bisphenol A—pentaerythritol phosphite polymer, and hydrogenated bisphenol A—phosphite polymer; and preferable exemplary compounds represented by the structural formula (3) include bis(tridecyl)pentaerythritol diphosphite, bis(nonylphenyl)pentaerythritol diphosphite, and distearylpentaerythritol diphosphite; and in addition to the triesters as described above, di- and monoesters produced by partial hydrolysis of the triesters can also be used, and such compounds may be used either alone or in combination of two or more. These phosphite ester compound exhibits reduced steric hindrance near the phosphorus atom.

In view of the storage stability, the particularly preferred among the phosphite ester compounds represented by the structural formula (2) or (3) are those having a structure wherein at least one of ester moiety (—P—O—R) is the one containing an aromatic ring such as benzene ring. When the aromatic group has a substituent, the substituent is preferably an alkyl group having 1 to 6 carbon atoms located at meta or para position. Among the compounds represented by structural formula (3), also preferred are those having a structure wherein the ester moiety (—P—O—R) includes an alkyl group.

Diarylmonoalkyl phosphites among the compounds represented by the structural formula (2), and the compounds having the chemical structure of diarylpentaerythritol diphosphite or dialkylpentaerythritol diphosphite among the compounds represented by the structural formula (3) are preferable in view of the high storage stability.

Exemplary diarylmonoalkyl phosphites include diphenylmono(2-ethylhexyl)phossphite, diphenylmonodecyl phosphite, and diphenylmono(tridecyl)phossphate; exemplary diarylpentaerythritol diphosphites include bis(nonylphenyl)pentaerythritol diphosphite; and exemplary dialkylpentaerythritol diphosphites include distearylpentaerythritol diphosphite.

In view of the compatibility, the particularly preferred among the phosphate ester compounds represented by the structural formula (2) or (3) are those having a structure wherein at least one of ester moiety (—P—O—R) is the one containing an aromatic ring such as benzene ring. When the aromatic group has a substituent, the substituent is preferably an alkyl group having 1 to 6 carbon atoms located at meta or para position.

Of such phosphite ester compounds, diarylmonoalkyl phosphites and monoaryldialkyl phosphites among the compounds represented by the structural formula (2), and arylmonoalkylpentaerythrithol diphosphites among the compounds represented by the structural formula (3) are preferable.

Exemplary diarylmonoalkyl phosphites include diphenylmono(2-ethylhexyl)phossphite, diphenylmonodecyl phosphite, and diphenylmono(tridecyl)phossphite; exemplary monparyldialkyl phosphites include phenyldidecyl phosphite; and; exemplary arylmonoalkylpentaerythritol diphosphites include bisphenyltridecylpentaerythritol diphosphite.

The phosphite ester compound used may by a commercially available phosphites such as JPM-308, JPM-311, JPM-313, or JPP 2000 manufactured by Johoku Kagaku K.K.; or C, 135A, PEP-8, PEP-4C, PEP-8W, PEP-11C, PEP-24G, PEP-36, PEP-36Z, HP-10, 2112, 2112RG, 260, 522A, 329K, 1178, 1500, 3010, or TPP of Adecastab series manufactured by Asahi Denka Kogyo K.K.

Among these, the preferred are JPM-308, JPM-311, JPM-313, JPP-13, JPP-31, and the like manufactured by Johoku Kagaku K.K.

The phosphite ester compound is preferably added in an amount of 0.1 to 30 parts by weight, and more preferably, in an amount of 1 to 8 parts by weight per 100 parts by weight of the resin component. When the content of the phosphite ester is less than 0.1 parts by weight, the storage stability is not sufficiently improved while content in excess of 30 parts by weight invites loss of curability and adhesion.

<9> Reactive Diluent: Liquid Glycidylamine Compound

In the case of thiirane-containing resin, thiirane ring is a group having a reactivity higher than the oxirane ring, and the thiol group generated by the ring opening is a group having an acidity higher than that of the hydroxyl group, and this accelerates autopolymerization between the thiol group and the thiirane ring to invite increase in the viscosity. Thiirane-containing resin also suffer from high susceptibility to crystallization because of the strong interaction between the thiirane-containing resins.

The composition of the present invention may contain a liquid glycidylamine compound as a reactive diluent in addition to the thiirane-containing resin as described above. The liquid glycidylamine compound then functions as a diluent before the curing of the thiirane-containing resin to reduce viscosity of the resin composition and to prevent the crystallization of the resin composition, and upon curing of the resin composition, the liquid glycidylamine compound reacts with and bonds to the functional group of the thiirane-containing resin. The mechanism for the prevention of the crystal formation by the addition of the glycidylamine compound is not clearly found out. However, it is estimated that the high compatibility of the glycidylamine compound with the thiirane-containing compound specifically inhibits the interaction between the thiirane-containing compound.

The liquid glycidylamine compound used in the present invention may be a liquid glycidylamine compound having at least one glycidyl group and at least one amino group. The merits of preventing the crystal formation and reduction in viscosity are attained because the glycidylamine compound is liquid. The liquid glycidylamine compound is preferably the one having a freezing point of not more than 0° C., and in view of realizing acceptable curability in cold district, liquid glycidylamine compound is preferably the one having a freezing point of not more than −40° C.

The glycidylamine compound is preferably a diglycidylamine compound having two glycidyl groups in view of the satisfactory mechanical properties of the cured product. The liquid glycidylamine compound is preferably blended at a weight ratio of the resin component to the liquid glycidylamine compound of 95/5 to 60/40, and preferably, 90/10 to 70/30. When the content of the liquid glycidylamine compound is too low, the merits of the present invention are not fully realized while too much incorporation results in poor mechanical properties of the cured product.

Exemplary liquid glycidylamine compounds include tetraglycidyldiaminodiphenylmethane (TGDDM), triglycidyl-p-aminophenol (TGPAP), triglycidyl-m-aminophenol (TGMAP), diglycidylaniline (DGA), diglycidyltoluidine (DGT), tetraglycidylmethaxylilenediamine (TGMXA), and tetraglycidylbisaminomethylcyclohexane, and use of diglycidylaniline (DGA) and diglycidyltoluidine (DGT) are particularly preferable.

The composition of the present invention containing a dehydrating agent, a ketimine compound, a curing accelerator, a phosphate ester compound, and liquid glycidylamine compound in addition to the thiirane-containing resin exhibits higher storage stability and faster curing speed, namely, higher balance between the storage stability and the fast curing properties compared to the composition obtained by blending one of such compounds with the thiirane-containing resin.

<10> Additives

The composition of the present invention may further comprise various optional additives in addition to the compound (A), the compound (B), and the curing agent as described above. Examples of such additives are a filler, a plasticizer, a thixotropic agent, a pigment, a dye, an antiaging agent, an antioxidant, an antistatic agent, a flame retardant, a tackifier, a dispersant, and a solvent.

The filler used may have various shapes, and exemplary fillers include organic and inorganic fillers such as fumed silica, calcined silica, precipitated silica, pulverized silica, and molten silica; diatomaceous earth; iron oxide, zinc oxide, titanium oxide, barium oxide, and magnesium oxide; calcium carbonate, magnesium carbonate, and zinc carbonate; talc clay, kaolin clay, and calcined clay; carbon black; and any one of these further treated with a fatty acid, a resin acid, or a fatty acid ester. Such fillers may be used either alone or in combination of two or more.

Exemplary plasticizers include dioctyl phthalate (DOP) and dibutyl phthalate (DBP); dioctyl adipate and isodecyl succinate; diethylene glycol dibenzoate, and pentaerythritol ester; butyl oleate and acetylricinoleic methyl; tricresyl phosphate and trioctyl phosphate; and adipic propylene glycol polyester and adipic butylene glycol polyester. These plasticizers may be used either alone or in combination of two ore more.

Exemplary antioxidants include butylhydroxytoluene (BHT) and butylhydroxyanisole (BHA).

Exemplary antiaging agents include compounds such as hindered phenol.

Exemplary pigments include inorganic pigments such as titanium dioxide, zinc oxide, ultramarine, iron oxide, lithopone, lead, cadmium, iron, cobalt, aluminum, chloride, and sulfate; and organic pigments such as azo pigment and copper phthalocyanine pigment.

Exemplary thixotropic agents include AEROSIL (manufactured by Nippon Aerosil K.K.), Dispalon (manufactured by Kusumoto Kasei K.K.), calcium carbonate, and teflon; and typical antistatic agents are hydrophilic compounds such as a quaternary ammonium salt, a polyglycol, an ethylene oxide derivative.

Exemplary tackifiers include terpene resin, phenol resin, terpene-phenol resin, rosin resin, and xylene resin.

Exemplary flame retardants includes chloroalkyl phosphate, dimethylmethylphosphonate, bromine-phosphorus compound, ammonium polyphosphate, neopentylbromide-polyether, and brominated polyether.

<11> Reaction of Compound (A) in its Curing

Compound (A) which is the main component in the composition of the present invention contains at least one thiirane ring in its molecule, and the composition of the present invention exhibits adhesive strength stronger than conventional epoxy resin-based adhesives since curing of the present composition involves not only the generation of hydroxyl group but also the generation of thiol group which has an acidity higher than that of the hydroxyl group as typically shown by the following scheme:

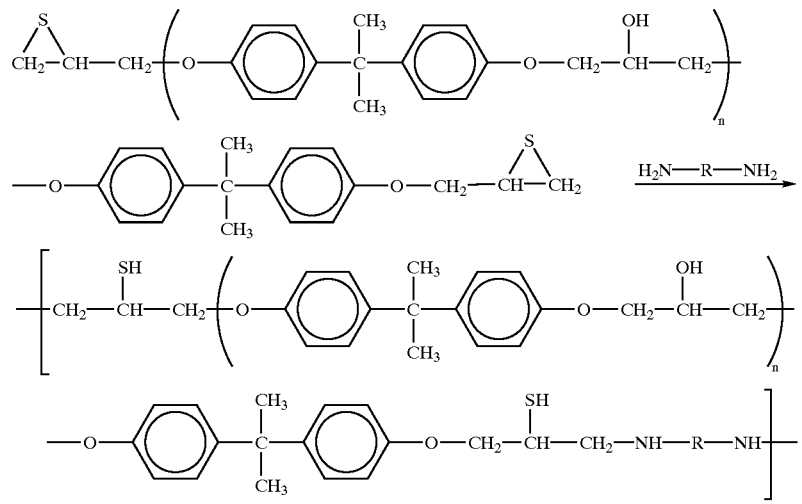

In addition, the composition of the present invention exhibits fast curing properties since the thiirane ring has a reactivity higher than that of the oxirane ring.

When the curing agent used contains at least one alicyclic polyamine compound, the composition exhibits improved handling convenience with prolonged pot life (usable period) and fast curing properties with no delay in the curing even at a low temperature of, for example, 0° C. It is estimated that the pot life is maintained at an acceptable level by steric hindrance of the alicyclic polyamine compound molecule used for the curing agent, and the fast curing by the sterically hindered alicyclic polyamine compound is realized by the high reactivity of the thiirane ring.

The high reactivity of the thiirane ring also contributes for the reduction in the cost of the raw materials since amount of the curing agent used can be reduced compared to the use of the curing agent containing only the thiirane ring and no oxirane ring.

[2] Resin Compositions of the Present Invention

<1> First Aspect of the Present Invention

The adhesive composition according to the first aspect of the present invention is an adhesive composition which contains the compound (A) or the compounds (A) and (B), and which has a ratio of oxirane ring content/thiirane ring content of 90/10 to 10/90.

The adhesive composition according to the first aspect of the present invention may be either the one containing both of the compound (A-1) which has only thiirane ring and the Compound (A-2) which has both thiirane ring and oxirane ring; or the one containing either one of the compound (A-1) and the compound (A-2). For example, the adhesive composition may be any one of the following compositions comprising different combination of the components:

(i) the composition containing the compounds (A-1) and (B);

(ii) the composition containing only the compound (A-2);

(iii) the composition containing the compounds (A-2) and (B); and (iv) the composition containing the compounds (A-1), (A-2), and (B).

When a composition capable of developing a high adhesive strength is particularly required in the first aspect of the present invention, the composition may preferably comprise the components of the combination (iii).

In the adhesive composition according to the first aspect of the present invention, the ratio of the content of oxirane ring/thiirane ring is in the range of 90/10 to 10/90 since both hydroxyl group and mercapto group can be generated upon curing of the composition when the ratio is within such range, and preferably in the range of 50/50 to 90/10 since a composition exhibiting high adhesive strength can be obtained when the ratio is within such range.

The curing agent used in the adhesive composition according to the first aspect of the present invention is not limited to any particular type, and any curing agent generally used as the curing agent in an epoxy resin-based adhesive may be employed. In the adhesive composition according to the first aspect of the present invention, use of at least one member selected from the compounds having hydroxyl group, mercapto group, amino group, carboxyl group, or isocyanate group and the compounds having acid anhydride structure is particularly preferable. Exemplary such curing agents include amine curing agent, acid or acid anhydride curing agent, basic active hydrogen-containing compounds, imidazoles, polymercaptane curing agents, phenol resins, urea resins, melamine resins, isocyanate curing agents, latent curing agents, and UV curing agents.

Exemplary curing agents are amine curing agents, acid or acid anhydride curing agents, imidazoles, polymercaptane curing agents, isocyanate curing agents, latent curing agents similar to those described in [1]<5> Curing agent and <6> Ketimine compound, and such curing agent may be blended at an equivalent ratio similar to the one described in [1]<5> Curing agent and <6> Ketimine compound.

When at least one alicyclic polyamine compound is incorporated as an amine curing agent, the resulting composition will exhibit prolonged pot life, high curing speed at a low temperature, and good balance between the pot life and the curing time at a low temperature. The alicyclic polyamine compound may be used either in combination with other amine curing agent or alone. Exemplary alicyclic polyamine compounds are similar to those described in [1]<5> Curing agent. When used in combination with other curing agent, the alicyclic polyamine compound may be blended at an equivalent ratio similar to the one described in [1]<5> Curing agent.

In addition, the adhesive composition according to the first aspect of the present invention will exhibit excellent fast curing properties at room temperature when the compound (A) or the compounds (A) and (B) is a liquid compound having a viscosity at 25° C. of up to 100000 mPa·s, and preferably up to 30000 mPa·s, and in addition, when the composition contains a liquid curing agent having a viscosity at 25° C. of up to 100000 mPa·s, and preferably up to 30000 mPa·s, and such adhesive composition will be suitable for use as a low temperature curing adhesive composition for rubber, metal or plastics or for civil engineering and construction purposes.

Exemplary liquid curing agents having a viscosity at 25° C. of up to 30000 mPa·s are similar to those given as examples in [1]<5> Curing agent.

In the first aspect of the present invention, when the content of thiirane is x, and equivalent ratio of the curing agent to the total of oxirane ring and thiirane ring is y in the adhesive composition according to the first aspect of the present invention, x and y may preferably meet the relation (1) described in [1]<5> Curing agent when $10\% \leq x < 50\%$, and the relation (2) when $50\% \leq x \leq 90\%$. More illustratively, x and y are:

when $$10\% \leq x < 50\%,$$

$$y = (1 - x/100) \pm 0.2 \quad (1),$$

and when $$50\% \leq x \leq 90\%,$$

$$0.1 \leq y \leq 0.7 \quad (2).$$

The reason why the relation (1) is preferably met when $10\% \leq x < 50\%$ is the same as the reason why x and y may preferably meet the relation (1) when $x < 50\%$ as described in [1]<5> Curing agent.

The reason why the relation (2) is preferably met when $50\% \leq x \leq 90\%$ is the same as the reason why x and y may preferably meet the relation (2) when $50\% \leq x$ as described in [1]<5> Curing agent.

In view of the adhesion, it is more preferable that y is given by the relation: $y = (1 - x/100) - 0.1$.

The adhesive composition according to the first aspect of the present invention may further comprise a curing accelerator in addition to the curing agent as described above. Typical curing accelerators are a phenol and a tertiary amine. Exemplary tertiary amines are similar to those described in [1]<7> Curing accelerator.

The adhesive composition according to the first aspect of the present invention may further comprise optional additives in addition to the compound (A) or the compound (B) and the curing agent. For example, the composition may have blended therein a filler, a plasticizer, a thixotropic agent, a pigment, a dye, an antiaging agent, an antioxidant, an antistatic agent, a flame retardant, a tackifier, a dispersant, a solvent or the like.

Exemplary fillers, plasticizers, thixotropic agents, pigments, antiaging agents, antioxidants, antistatic agents, flame retardants, and tackifiers are similar to those described in [1]<10> Additives.

As described in [1]<11> Reaction of compound (A) in its curing, the compound (A) which is the main component in the adhesive composition according to the first aspect of the present invention exhibits an adhesive strength stronger that of the conventional epoxy resin-based adhesives as well as excellent fast curing properties.

When at least one alicyclic polyamine compound is used for the curing agent of the adhesive composition according to the first aspect of the present invention, the composition exhibits notably improved handling convenience with prolonged pot life (usable period) and fast curing properties with no delay in the curing even at a low temperature of, for example, 0° C.

The adhesive composition according to the first aspect of the present invention wherein the compound (A) and the compound (B), namely, the main components have a viscosity at 25° C. not exceeding the predetermined value, and the adhesive composition of the present invention which further comprises a liquid curing agent are preferable for use as a low temperature curable adhesive composition since they have excellent curability at room temperature. Therefore, the adhesive composition according to the first aspect of the present invention is adapted for use as an adhesive for civil engineering purposes, and use of such composition enables reduction of construction period owing to the fast curing properties of the composition. The use of the adhesive composition according to the first aspect of the present invention which has excellent curability as an adhesive for civil engineering purposes contributes for the reduction of the construction period.

Use of the adhesive composition according to the first aspect of the present invention also enables reduction in the cost of the raw materials since the high reactivity of the thiirane ring enables reduction in the amount of the curing agent used compared to the curing agent containing no thiirane ring and only oxirane ring.

The adhesive composition as described above may further imparted with flexibility to provide a product having a low modulus without detracting from the advantageous properties as described above. In addition, the adhesive composition of the present invention enables improvement of the working conditions in its use since the present adhesive composition has significantly reduced odor compared to the conventional fast curing compositions with no sacrifice in the fast curing properties.

<2> Second Aspect of the Present Invention

The second aspect of the present invention is directed to a resin composition for sealant containing at least one member selected from the group consisting of polysulfide resin, urethane resin, silicone resin, modified silicone resin and butyl rubber in addition to the compound (A) or the compounds (A) and (B); and a resin composition for sealant further a comprising 10 to 200 parts by weight of an inorganic filler and 10 to 200 parts by weight of a plasticizer per 100 parts by weight of said compound (A) or total of said compounds (A) and (B). The resin composition for sealant according to the second aspect of the present invention is also referred to as the resin composition for sealant of the present invention.

The polysulfide resin used in the second aspect of the present invention is a polymer having reactive mercapto group at its terminal, and preferably, the one having —(R—$S_m)_n$— in its backbone. An average value of m is in the range of 1.5 to 2.5, and n is 2 to 45. R is a divalent aliphatic group, and oxygen may be present between the carbon atoms. The polysulfide resin may be used alone or as a mixture of two or more polysulfide resins. The polysulfide resin used may be a commercially available resin such as LP-3 manufactured by Thiokol Chemical.

When a polysulfide resin is incorporated in the resin composition for sealant of the present invention, the composition will enjoy the merits of particularly increased flexibility and impact resistance as well as reduced shrinkage upon curing.

The urethane resin used is not limited to any particular type, and any conventional urethane resin synthesized from a urethane prepolymer and a polyisocyanate compound may be utilized.

Incorporation of the urethane resin in the resin composition for sealant of the present invention has the merits of increased flexibility and impact resistance.

Silicone resin is a copolymer produced by copolymerization of a polyfunctional siloxane, and in the second aspect of the present invention, silicone resins as produced as well as those modified with an organic resin, for example, modified silicone resins such as an alkyd-modified silicone resin and epoxy-modified silicone resin can be used. When a silicone resin is incorporated in the resin composition for sealant of the present invention, the resin enjoys the merits of increased flexibility as well as improved weather resistance.

When a modified silicone resin is incorporated in the resin composition for sealant of the present invention, the composition enjoys the merits of increased flexibility as well as improved impact resistance.

The butyl rubber used may be a halogenated butyl rubber such as brominated butyl rubber and chlorinated butyl rubber. When a butyl rubber is incorporated in the resin composition for sealant of the present invention, the resin enjoys the merits of increased flexibility as well as improved air tightness.

Each of the polysulfide resin, urethane resin, silicone resin, modified silicone resin, and butyl rubber may be used either alone or in combination of two or more.

At least one member selected from the group consisting of the polysulfide resin, urethane resin, silicone resin, modified silicone resin, and butyl rubber (hereinafter referred to as the polymer) and the compound (A) or the compounds (A) and (B) may be blended in the resin composition for sealant of the present invention at a blend ratio:

[at least one member selected from the above-described polymers]/[the compound (A) or the compounds (A) and (B)]

of 50/50 to 80/20, and preferably, 60/40, to 70/30. When the blend ratio is within such range, adhesive strength and tensile strength of the resulting resin composition for sealant can be improved, and the composition can be imparted with the properties, such as flexibility inherent to other resins Without detracting from the mechanical properties.

The inorganic filler used may have various shapes, and exemplary inorganic fillers include fumed silica, calcined silica, precipitated silica, pulverized silica, and molten silica; iron oxide, zinc oxide, titanium oxide, barium oxide, and magnesium oxide; calcium carbonate, magnesium carbonate, and zinc carbonate; and carbon black, which may be used either alone or in combination of two or more.

The inorganic filler may be blended in an amount of 10 to 200 parts by weight, and preferably, 50 to 100 parts by weight per 100 parts by weight in total of said at least one polymer and the compound (A) or the compounds (A) and (B). When the inorganic filler used is in such range, the resulting resin composition for sealant of the present invention will be provided with improved tensile strength without detracting from the flexibility.

Exemplary plasticizers are similar to those given as examples in [1]<10> Additives. These plasticizer may be used either alone or as a mixture of two or more such plasticizers.

The plasticizer may be blended in an amount of 10 to 200 parts by weight, and preferably 50 to 150 parts by weight per 100 parts by weight in total of said at least one polymer and the compound (A) or the compounds (A) and (B). When the plasticizer used is in such range, the resulting resin composition for sealant of the present invention will be provided with improved flexibility to enable the production of a product having a low modulus.

The resin composition for sealant of the present invention may contain a curing agent for the curing of the compound (A) or the compound (B) as in the case of the adhesive composition according to the first aspect of the present invention. Exemplary curing agents are those generally used as a curing agent in an epoxy resin-based adhesive, for example, those described in [1]<5> Curing agent and [1]<6> Ketimine compound.

In addition to the components as described above, the resin composition for sealant may further contain various additives such as a thixotropic agent, a pigment, a dye, an antiaging agent, an, antioxidant, an antistatic agent, a flame retardant, a tackifier, a dispersant, a solvent or the like to the extent that does not detract from the object of the present invention. Exemplary such additives are similar to those described in [1]<10> Additives.

The resin composition for sealant of the present invention may be produced either in the form of a one part resin composition or a two part resin composition. When the resin composition is produced in the form of a two part resin composition, the polymer as described above may be included either in the main component or in the curing agent.

The resin composition for sealant of the present invention which has the constitution as described above exhibits excellent fast curing properties, adhesive strength equivalent or stronger than that of the conventional epoxy resin adhesives, satisfactory tensile strength, and reduced odor enabling the maintenance of good working conditions. The resin composition for sealant of the present invention also exhibits improved flexibility after curing to enable production of the product having a low modulus, as well as excellent impact resistance, weatherability, and air tightness. When the resin composition for sealant of the present invention is incorporated with an inorganic filler and a plasticizer in addition to the polymer as described above, the resin composition will further exhibit improved flexibility, and tensile strength will also be imparted without detracting from the flexibility.

<3> Third Aspect of the Present Invention

Next, the resin composition for a coating composition and a coating agent according to the third aspect of the present invention is described in detail.

The resin composition for a coating composition and a coating agent according to the third aspect of the present invention is a resin composition containing the compound (A) or the compounds (A) and (B), wherein said composition contains oxirane ring and thiirane ring at a ratio of oxirane ring/thiirane ring of 95/5 to 1/99, and wherein said composition further contains at least one curing agent selected from the group consisting of compounds containing hydroxyl group, mercapto group, amino group, or carboxyl group.

The resin composition for a coating composition and a coating agent according to the third aspect of the present invention may be either the one containing both of the compound (A-1) which has only thiirane ring and the compound (A-2) which has both thiirane ring and oxirane ring; or the one containing either one of the compound (A-1) and the compound (A-2). For example, the resin composition may be any one of the following compositions comprising different combination of the components:

(i) the composition containing the compounds (A-1) and (B);

(ii) the composition containing only the compound (A-2);

(iii) the composition containing the compounds (A-2) and (B); and (iv) the composition containing the compounds (A-1), (A-2), and (B).

When a composition capable of developing a high adhesive strength is particularly required in the third aspect of the present invention, the composition may preferably comprise the components of the combination (iii).

In the resin composition for a coating composition and a coating agent according to the third aspect of the present invention, the ratio of oxirane ring/thiirane ring may be determined within the range of 95/5 to 1/99 by taking balance between the curing time and the pot life into consideration. The ratio is preferably in the range of 90/10 to 50/50 because the resulting composition exhibits high adhesive strength when the ratio is within such range owing to the generation of both hydroxyl group and mercapto group in the course of curing. Increase in the thiirane content results in faster curing.

The resin composition for a coating composition and a coating agent according to the third aspect of the present invention further comprises at least one curing agent selected from the group consisting of compounds containing hydroxyl group, mercapto group, amino group, or carboxyl group. Exemplary such curing agents include amine curing agent, carboxylic acid curing agent, basic active hydrogen-containing compounds, imidazoles, polymercaptane curing agents, phenol resins, urea resins, melamine resins, and latent curing agents.

Examples of the amine curing agent, carboxylic acid curing agent, basic active hydrogen-containing compounds, imidazoles, polymercaptane curing agents, and latent curing agents are similar to the amine curing agent, acid (carboxylic acid) curing agent, imidazoles, polymercaptane curing agents, and latent curing agents described in [1]<5> Curing agent and <6> Ketimine compound.

When the content of thiirane is x, and equivalent ratio of the curing agent to the total of oxirane ring and thiirane ring is y in the resin composition for a coating composition and a coating agent according to the third aspect of the present invention, x and y may preferably meet the following relations (1) and (2):

when $$5\% \leq x < 50\%,$$

$$y = (100-x)/100 \pm 0.2 \tag{1},$$

and when $$50\% \leq x \leq 99\%,$$

$$0.1 \leq y \leq 0.7 \tag{2}.$$

The reason why the relation (1) is preferably met when $5\% \leq x < 50\%$ is the same as the reason why x and y may preferably meet the relation (1) when x<50% as described in [1]<5> Curing agent.

The reason why the relation (2) is preferably met when 50%≦x≦99% is the same as the reason why x and y may preferably meet the relation (2) when 50%≦x as described in [1]<5> Curing agent.

When the curing agent is used at an equivalent ratio smaller than the range as specified above, curing reaction will not be sufficiently promoted and the composition will suffer from insufficient adhesion.

When x is less than 50%, the resulting composition will exhibit excellent curability when the x and y are within the range as described above, and it is more preferable that y is given by the relation: y=(1−x/100)−0.1.

The resin composition for a coating composition and a coating agent according to the third aspect of the present invention may further comprise a filler for modification. Exemplary such modification fillers include titanium oxide, zinc oxide, iron oxide, aluminum oxide, aluminum powder, barium sulfate, calcium phosphate, aluminum carbonate, magnesium carbonate, talc, clay, kaolin, mica, graphite, silica, diatomaceous earth, and asbestos which may be used alone or in combination of two or more. Among these, the preferred are talc and calcium carbonate.

The modification filler may be used in the resin composition for a coating composition and a coating agent according to the third aspect of the present invention at an amount of 3 to 50 parts by weight, and preferably, at an amount of 10 to 30 parts by weight per 100 parts by weight of said compound (A) or total of said compounds (A) and (B). When the modification filler used is within such range, the resin composition for a coating composition and a coating agent according to the third aspect of the present invention will exhibit favorable thixotropy.

The resin composition for a coating composition and a coating agent according to the third aspect of the present invention containing the compound (A) or the compounds (A) and (B) may contain the curing agent and the modification filler, and in addition, at least one member selected from a colorant, a thickener, an antiseptic, and an emulsifier at an amount of 1 to 30 parts by weight per 100 parts by weight of said compound (A) or total of said compounds (A) and (B).

Exemplary colorants include inorganic pigments and organic pigments. Exemplary inorganic pigments include titanium dioxide, zinc oxide, ultramarine, iron oxide, lithopone, lead, cadmium, iron, cobalt, aluminum, chloride, and sulfate, and exemplary organic pigments include azo pigments and copper phthalocyanine pigments.

Exemplary thickeners are those which are capable of imparting a high viscosity with the composition such as methyl cellulose (CMC) and calcium carbonate.

Exemplary antiseptics include organotin compounds, copper compounds, arsenic compounds, and chlorine compounds such as pentachlorophenol, pentachlorophenol laurate, copper-8-hydroxyquinoline, bis(tri-n-butyl tin) oxide, and quaternary ammonium salts. Incorporation of such an antiseptic effectively prevents deterioration and crack caused by bacteria and fungi under favorable conditions of appropriate temperature and high humidity.

Exemplary emulsifiers include bentonite and filler earth.

The resin composition for a coating composition and a coating agent according to the third aspect of the present invention may further comprise a curing accelerator in addition to the curing agent as described above. Typical curing accelerators are phenols and tertiary amines.

Exemplary tertiary amines are similar to the tertiary amines described in [1]<7> Curing accelerator.

In addition to the compound (A) or the compounds (B), the curing agent, the modification filler, and the at least one member selected from a colorant, a thickener, an antiseptic, and an emulsifier, the resin composition for a coating composition and a coating agent according to the third aspect of the present invention may optionally contain an additive such as a plasticizer, a thixotropic agent, an anti-aging agent, an antioxidant, an antistatic agent, a flame retardant, a tackifier, a dispersant, and a solvent.

Exemplary plasticizers, thixotropic agents, antistatic agent, antiaging agents, antioxidants, flame retardants, and tackifier are similar to those described in [1]<10> Additives.

In the resin composition for a coating composition and a coating agent according to the third aspect of the present invention, the compound (A) which is the main component contains at least one thiirane ring in its molecule, and the thiirane ring opens upon curing of the composition to generate thiol group which has an acidity higher than that of hydroxyl group, and therefore, the composition of the present invention exhibits adhesive strength stronger than the conventional epoxy resin-based coating compositions and coating agents. Since thiirane ring has a reactivity higher than that of the oxirane ring, the resin composition exhibits fast curing properties with the pot life maintained at sufficient level. In addition, the resin composition for a coating composition and a coating agent according to the third aspect of the present invention has reduced odor.

Accordingly, when the resin composition for a coating composition and a coating agent according to the third aspect of the present invention is used in painting work or the like, work period can be reduced since the resin composition has fast curing properties, and the working environment can be maintained at a good level since the resin composition has reduced odor. In addition, the surface that has been coated is less likely to undergo peeling since the resin composition exhibits strong adhesion.

The resin composition for a coating composition and a coating agent according to the third aspect of the present invention wherein the content x of thiirane and the ratio y in equivalent of the curing agent to the total of oxirane ring and thiirane ring meet the following relations (1) and (2) is preferable in view of the excellent adhesion and curability.

It should also be noted that the resin composition for a coating composition and a coating agent according to the third aspect of the present invention containing the modification filler exhibits a thixotropy higher that of the epoxy resin-based coating composition and coating agent, and the resin composition is less likely to exhibit sagging when used in the painting work.

<4> Fourth Aspect of the Present Invention

The fourth aspect of the present invention is the resin composition for electric applications.

The composition described in the third aspect of the present invention comprising the compound (A) or the compounds (A) and (B), containing oxirane ring and thiirane ring at a ratio of oxirane ring/thiirane ring of 95/5 to 1/99, and further comprising at least one curing agent selected from the group consisting of compounds containing hydroxyl group, mercapto group, amino group, or carboxyl group is also suitable for use as a resin composition for electric applications. The resin composition for electric applications according to the fourth aspect of the present invention comprises such composition. However, the resin composition for electric applications according to the fourth aspect of the present invention may preferably contain a flame retardant instead of the modification filler, colorant, thickener, or antiseptics which may be optionally incorporated in the resin composition for a coating composition and a coating agent according to the third aspect of the present invention.

In the case of the resin composition for electric applications according to the fourth aspect of the present invention, when the epoxy compound used for producing the compound (A) or the compound (B) is the one having hydrogen atom or other group in its molecule substituted with a halogen atom (the epoxy compound indicated by structural formula (g) in [1]<1> Compound (A)), the halogen content is preferably 1 to 10% by weight of the compound (A) or the total of the compounds (A) and (B).

In order to impart the composition with the flame retardancy, the compound (A) is preferably the one synthesized by using the various epoxy compounds described in [1]<1> Compound (A) and wherein hydrogen atom or other group in the molecule, for example, methyl group bonded to the aromatic ring is substituted with bromine atom.

Exemplary compound (A) used in the resin composition for electric applications according to the fourth aspect of the present invention are those given as examples in [1]<1> Compound (A) as in the case of the third aspect of the present invention. The compound (A), however, is preferably the one wherein hydrogen atom or other group in the molecule is partly substituted with bromine atom.

In order to impart the composition with the flame retardancy, it is preferable that the compound (B) is also the one wherein hydrogen atom or other group in the molecule is partly substituted with bromine atom as in the case of the compound (A).

In the resin composition for electric applications according to the fourth aspect of the present invention, the content x of thiirane and ratio y in equivalent of the curing agent to the total of oxirane ring and thiirane ring may preferably meet the relation (1): $y=(100-x)/100\pm0.2$ when $5\% \leq x < 50\%$, and the relation (2): $0.1 \leq y \leq 0.7$ when $50\% \leq x \leq 99\%$. When the curing agent is used at an equivalent ratio greater than the range as specified above, cost of the raw materials will be excessively high since conventional curing agents are generally expensive. When the curing agent is used at an equivalent ratio smaller than the range as specified above, curing reaction will not be sufficiently promoted and the composition will suffer from insufficient curing and insufficient adhesion. When x is less than 50%, the resulting composition will exhibit excellent curability when the x and y are within the range as described above, and it is more preferable that y is given by the relation: $y=(1-x/100)-0.1$.

As described above, the resin composition for electric applications according to the fourth aspect of the present invention may preferably contain a flame retardant. Typical flame retardants are phosphorus, antimony, halogen, aluminum, and magnesium-based flame retardants, and exemplary flame retardants include zirconium hydroxide, barium metaborate, aluminum hydroxide, magnesium hydroxide, tricresyl phosphate, diphenylcredyl phosphate, diphenyloctyl phosphate, trischloroethyl phosphate, tributyl phosphate, tris(dibromopropyl)phossphate, chloroalkyl phosphate, ammonium polyphosphate, chlorophosphonate, bromophosphonate, dimethyl methylphosphonate, ethane tetrabromide, chlorinated paraffin, chlorinated polyphenyl, antimony trioxide, antimony pentaoxide, neopentylbromide-polyether, and brominated polyether, which may be used alone or in combination of two or more.

A preferable combination of the compound (A), the compound (B), and the flame retardant is use of a halogenated epoxy compound as the compound (A) or the compound (B) with an antimony-based flame retardant since a significant improvement in the flame retardancy can be expected for this combination.

The content of the flame retardant in the resin composition for electric applications according to the fourth aspect of the present invention is preferably 2 to 30 parts by weight, and more preferably 5 to 20 parts by weight per 100 parts of the compound (A) or the total of the compounds (A) and (B) in view of the flame retardancy imparted to the composition.

The resin composition for electric applications according to the fourth aspect of the present invention may further comprise a curing accelerator in addition to the curing agent. Typical curing accelerators are a phenol and a tertiary amine. Exemplary tertiary amines are similar to those described in the third aspect of the present invention.

The resin composition for electric applications according to the fourth aspect of the present invention may further comprise optional additives in addition to the compound (A) or the compound (B), the curing agent, and the flame retardant. For example, the composition may have blended therein a filler, a plasticizer, a thixotropic agent, an antiaging agent, an antioxidant, an antistatic agent, a tackifier, a colorant, a dispersant, a solvent or the like. Exemplary fillers, plasticizers, thixotropic agents, antiaging agents, antioxidants, antistatic agents, tackifiers and colorants are similar to those described in third aspect of the present invention.

In the resin composition for electric applications according to the fourth aspect of the present invention, the compound (A) which is the main component contains at least one thiirane ring in its molecule, and the thiirane ring opens upon curing of the composition to generate thiol group which has an acidity higher than that of hydroxyl group, and therefore, the composition of the present invention exhibits adhesive strength stronger than the conventional resin compositions that had been used for electric applications such as potting resin for print circuit boards and resin for impregnation in prepregs. Since thiirane ring has a reactivity higher than that of the oxirane ring, the resin composition exhibits fast curing properties. Cured epoxy resins generally exhibit good insulation, and the resin composition for electric applications according to the fourth aspect of the present invention exhibits such good insulation more rapidly since the resin composition has fast curing properties. In addition, the resin composition for electric applications according to the fourth aspect of the present invention has reduced odor.

Accordingly, when the resin composition for electric applications according to the fourth aspect of the present invention is used in the production of print circuit boards and prepregs, production period can be reduced since the resin composition has fast curing properties, and the working environment can be maintained at a good level since the resin composition has reduced odor.

The resin composition for electric applications according to the fourth aspect of the present invention wherein the content x of thiirane and the ratio y in equivalent of the curing agent to the total of oxirane ring and thiirane ring in the compounds (A) and (B) which are the main components meet the following relations (1) and (2) is preferable in view of the excellent adhesion and curability.

The resin composition for electric applications according to the fourth aspect of the present invention containing the flame retardant exhibits a flame retardancy higher than that of the conventional potting resins for print circuit boards and resins for impregnation in prepregs, and such high flame retardancy greatly contributes for improvement in the safety and reliability of the electric and electronic appliances produced by using the resin composition for electric applications according to the fourth aspect of the present invention.

<5> Resin Composition According to Fifth Aspect of the Present Invention

The resin composition according to the fifth aspect of the present invention is a resin composition containing the compound (A) wherein said composition contains oxirane ring and thiirane ring at a ratio of oxirane ring/thiirane ring within the predetermined range, and has a moisture content of not more than 1000−10x (ppm) (wherein x represents content (%) of thiirane). This resin composition exhibiting good storage stability simultaneously with fast curing properties is suitable for use as an adhesive and coating composition in civil engineering and construction applications.

The resin composition according to the fifth aspect of the present invention may be either the one containing both of the compound (A-1) which has only thiirane ring and the compound (A-2) which has both thiirane ring and oxirane ring; or the one containing the compound (A) with the compound (B). For example, the resin composition may be any one of the following compositions comprising different combination of the components:

(i) the composition containing only the compound (A-2);

(ii) the composition containing the compounds (A-1) and (B);

(iii) the composition containing the compounds (A-2) and (B); and (iv) the composition containing the compounds (A-1), (A-2), and (B).

The composition comprising the components of the combination (iii) is preferable in view of the high adhesive strength developed by the composition.

In the resin composition according to the fifth aspect of the present invention, the ratio of the content of oxirane ring/thiirane ring is in the range of 95/5 to 1/99 since both hydroxyl group and mercapto group are generated in the curing of the composition and the composition exhibits good storage stability when the ratio is in such range, and preferably, in the range of 90/10 to 60/40 since the composition exhibits high adhesive strength when the ratio is in such range.

The moisture content of the resin composition according to the fifth aspect of the present invention (ratio of the moisture weight in relation to the total weight of the composition) is adjusted to a range of value that reduces in inverse proportion to the thiirane content (%) of the resin composition according to the fifth aspect of the present invention in accordance with the following relation (3):

(Moisture content of the resin composition according to the fifth aspect of the present invention)≦1000−10x (ppm)   (3)

In the relation as described above, x represents thiirane content (%) in the resin composition according to the fifth aspect of the present invention.

The resin composition according to the fifth aspect of the present invention has a moisture content (ppm) which is adjusted to a value that reduces inversely proportional to the thiirane content from 1000 ppm at a predetermined rate in accordance with the relation (3), and therefore, the storage stability of the resin composition is maintained at a satisfactory level.

More illustratively, when the thiirane content is up to 60%, storage stability can be maintained at a sufficient level when the resin composition according to the fifth aspect of the present invention has a moisture content of up to 400 ppm.

Incorporation of a dehydrating agent is effective in achieving the low moisture content characteristic to the resin composition according to the fifth aspect of the present invention. Exemplary methods that may be employed for reducing the moisture content other than such incorporation of the dehydrating agent are azeotropy with toluene of the resin composition according to the fifth aspect of the present invention at the final stage of its production, and incorporation of an antihydrolytic agent in the resin composition according to the fifth aspect of the present invention.

The dehydrating agents which may be employed in the present invention include both inorganic (mineral) dehydrating agents and organic dehydrating agents. Examples of the inorganic (mineral) dehydrating agents and the organic dehydrating are similar to the dehydrating agents indicated in [1]<4> Dehydrating agent.

The dehydrating agent as described above may be used either alone or in combination of two or more. Also, an inorganic dehydrating agent may be used simultaneously with an organic dehydrating agent.

The dehydrating agent is preferably incorporated in the resin composition at an amount of 1 to 100 parts by weight, and more preferably at an amount of 5 to 25 parts by weight per 100 parts by weight of the compound (A) or the compounds (A) and(B) When the dehydrating agent is used in such amount, moisture content of the resin composition according to the fifth aspect of the present invention having a thiirane content as defined above can be reduced to a value within the range of the relation (3), and the storage stability of the resin composition according to the fifth aspect of the present invention at a high temperature, for example, 60° C. can be maintained at an acceptable level.

The resin composition according to the fifth aspect of the present invention can be produced as a two part adhesive wherein the compound (A) or the compounds (A) and (B), and preferably, the dehydrating agent are prepared separately from the curing agent, and the components are mixed at a predetermined ratio before their use for preparation of the adhesive; or as a one part adhesive wherein the compound (A) or the compounds (A) and (B) and the latent curing agent are preliminarily mixed.

The curing agent used in the fifth aspect of the present invention is not limited to any particular type, and any curing agent generally used as the curing agent in an epoxy resin-based adhesive may be employed. In the fifth aspect of the present invention, use of at least one member selected from the compounds having hydroxyl group, mercapto group, amino group, carboxyl group, or isocyanate group and the compounds having acid anhydride structure is particularly preferable. Exemplary such curing agents include amine curing agent, acid or acid anhydride curing agent, basic active hydrogen-containing compounds, imidazoles, polymercaptane curing agents, phenol resins, urea resins, melamine resins, isocyanate curing agents, latent curing agents, and UV curing agents.

Examples of the amine curing agent, acid or acid anhydride curing agent, basic active hydrogen-containing compounds, imidazoles, polymercaptane curing agents, and latent curing agents are similar to those described in [1]<5> Curing agent and <6> Ketimine compound, and such curing agent may be blended at an equivalent ratio similar to the one described in [1<]5> Curing agent and <6> Ketimine compound.

When at least one alicyclic polyamine compound is incorporated among the amine curing agents, the resulting composition according to the fifth aspect of the present invention will exhibit prolonged pot life, high curing speed at a low temperature, and good balance between the pot life and the curing time at a low temperature. The alicyclic polyamine compound may be used either in combination with other amine curing agent or alone. Exemplary alicyclic polyamine compounds are similar to those described in [1]<5> Curing agent. When used in combination with other curing agent, the alicyclic polyamine compound may be blended at a blend ratio similar to the one described in [1]<5> Curing agent.

The resin composition according to the fifth aspect of the present invention may further comprise a curing accelerator in addition to the curing agent as described above. Typical curing accelerators are a phenol and a tertiary amine. Exemplary phenols and tertiary amines are similar to those described in [1]<7> Curing accelerator.

These compounds may be blended either as a single compound or as a mixture of two or more such compounds.

The resin composition according to the fifth aspect of the present invention may further comprise optional additives in addition to the compound (A) or the compound (B) and the dehydrating agent or the curing agent which are preferable components. For example, the composition may have blended therein a filler, a plasticizer, a thixotropic agent, a pigment, a dye, an antiaging agent, an antioxidant, an antistatic agent, a flame retardant, a tackifier, a dispersant, a solvent or the like.

Exemplary fillers, plasticizers, thixotropic agents, pigments, antiaging agents, antioxidants, antistatic agent, flame retardants, and tackifier are similar to those described in [1]<10> Additives.

In the resin composition containing the thiirane ring-containing compound, storage stability of the resin composition can be maintained at an acceptable level when the resin composition has a low thiirane content or a low moisture content. The thiirane content, however, should be maintained above a predetermined value in order to maintain the adhesion and the curability, and in particular, the low temperature curability at a sufficient level. In addition, oxirane ring is preferably included at a predetermined content to realize the satisfactory adhesive strength.

In the resin composition according to the fifth aspect of the present invention having the constitution as described above wherein the ratio of the oxirane ring/thiirane ring and the moisture content of the resin composition has been adjusted to the predetermined range of values as described above, satisfactory storage stability at a high temperature, for example, 60° C. can be realized without detracting from the high adhesive strength, the fast curing properties, and in particular, the fast curing properties at a low temperature, and the reduced odor characteristic to the thiirane-containing resin.

In the resin composition according to the fifth aspect of the present invention containing a dehydrating agent, the moisture content of the resin composition according to fifth aspect of the present invention can be readily adjusted to a value within the preferable range.

The resin composition according to the fifth aspect of the present invention produced by using a bisphenol F epoxy compound as the epoxy compound for producing the compound (A) or the compound (B) is preferable since the resin composition exhibits low viscosity, and therefore, good workability.

<6> Sixth Aspect of the Present Invention

The resin composition having an improved storage stability according to the sixth aspect of the present invention is a resin composition containing a resin component comprising the compound (A) or the compounds (A) and (B) and a phosphite ester compound, wherein the oxirane ring and the thiirane ring are included in the resin component at a ratio of oxirane ring/thiirane ring of 95/5 to 1/99. The resin composition exhibits high adhesive strength, excellent low temperature curability, reduced odor and improved storage stability, and therefore, the resin composition is suitable for use as an adhesive.

The resin composition according to the sixth aspect of the present invention may contain both of the compound (A-1) which has only thiirane ring and the compound (A-2) which has both thiirane ring and oxirane ring. For example, the resin composition may be any one of the following compositions comprising different combination of the components:

(i) the composition containing only the compound (A-2);

(ii) the composition containing the compounds (A-1) and (B);

(iii) the composition containing the compounds (A-2) and (B); and (iv) the composition containing the compounds (A-1), (A-2), and (B).

The composition comprising the combination (iii) is preferable because the composition exhibits high adhesive strength.

In the resin composition according to the sixth aspect of the present invention, the ratio of the content of oxirane ring/thiirane ring is in the range of 95/5 to 1/99 when a composition exhibiting low temperature curability is to be obtained, and preferably in the range of 60/40 to 90/10 when a composition exhibiting high adhesive strength is to be obtained.

Thiirane-containing resin is a resin which exhibits excellent low temperature curability as well as good adhesion. This resin, however, suffers from the problem of insufficient storage stability.

The resin composition according to the sixth aspect of the present invention contains a phosphite ester compound in addition to the thiirane-containing resin as described above. The resin composition containing the phosphate ester compound in addition to the thiirane-containing resin according to the sixth aspect of the present invention exhibits a storage stability drastically improved over that of the composition containing the thiirane-containing resin but free from the phosphite ester compound while the low temperature curability and the adhesion are maintained at an equivalent level. Use of a phosphite ester compound having a structure with reduced degree of steric hindrance near the phosphorus atom is particularly effective in such improvement in the storage stability.

The phosphite ester compound is also a compound which is liquid with low viscosity while the thiirane-containing resin is a resin which has a viscosity higher than that of the epoxy resin which has oxirane ring instead the thiirane ring. Accordingly, viscosity of the composition can be reduced by the addition of a phosphite ester compound to the thiirane-containing resin and such reduction in viscosity is favorable in improving the workability.

The phosphite ester compound used in the sixth aspect of the present invention may be selected from various compounds which are esters of phosphonic acid, and the phosphite ester compound used is preferably at least one member selected from the group consisting of phosphite ester compounds represented by the following structural formula (2) or (3):

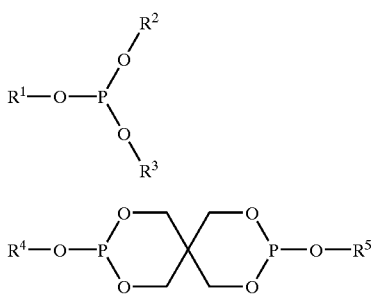

(2)

(3)

wherein $R_1$ to $R_5$ represent a hydrocarbon group containing up to 30 carbon atoms.

Examples of the phosphite ester compounds are similar to the exemplary compounds and preferable compounds thereof described for the structural formulae (2) and (3) in [1]<8> Phosphite ester compound, and commercially available phosphite ester compounds and the preferable products are those indicated in [1]<8> Phosphite ester compound.

The phosphite ester compounds preferable in view of the compatibility and the phosphite ester compounds preferable in view of the storage stability are similar to those described in [1]<8> Phosphite ester compound.

The phosphite ester compound may be used either alone or in combination of two or more.

The phosphite ester compound may be blended at an amount in the range described in [1]<8> Phosphite ester compound.

The curing agent used is not limited to any particular type, and any curing agent generally used as the curing agent in an epoxy resin-based adhesive may be employed. In the present invention, use of at least one member selected from the compounds having hydroxyl group, mercapto group, amino group, carboxyl group, or isocyanate group and the compounds having acid anhydride structure is particularly preferable. Exemplary such curing agents include amine curing agent, acid or acid anhydride curing agent, basic active hydrogen-containing compounds, imidazoles, polymercaptane curing agents, phenol resins, urea resins, melamine resins, isocyanate curing agents, latent curing agents, and UV curing agents.

Examples of such curing agents are amine curing agents, acid or acid anhydride curing agents, imidazoles, polymercaptane curing agents, isocyanate curing agents, and latent curing agents similar to those described in [1]<5> Curing agent and <6> Ketimine compound, and such curing agent may be blended at an equivalent ratio similar to the one described in [1]<5> Curing agent and <6> Ketimine compound.

When at least one alicyclic polyamine compound is incorporated as an amine curing agent, the resulting composition will exhibit prolonged pot life, high curing speed at a low temperature, and good balance between the pot life and the curing time at a low temperature. The alicyclic polyamine compound may be used either in combination with other amine curing agent or alone. Exemplary alicyclic polyamine compounds are similar to those described in [1]<5>Curing agent. When used in combination with other curing agent, the alicyclic polyamine compound may be blended at a blend ratio similar to the one described in [1]<5> Curing agent.

When the content of thiirane is x, and equivalent ratio of the curing agent to the total of oxirane ring and thiirane ring is y in the resin composition according to the sixth aspect of the present invention, x and y may preferably meet the following relations (1) and (2):
when $5\% \leq x < 50\%$, $y = (100-x)/100 \pm 0.2$           (1), and when $50\% \leq x \leq 99\%$, $0.1 \leq y \leq 0.7$           (2).

The reason why the relations (1) and (2) are preferably met when x is in the range as defined above is the same as the reason why x and y may preferably meet the relations (1) and (2) as described in [1]<5> Curing agent. When the curing agent is used at an equivalent ratio smaller than the range as specified above, curing reaction will not be sufficiently promoted and the composition will suffer from insufficient adhesion.

The resin composition according to the sixth aspect of the present invention may further comprise a curing accelerator in addition to the curing agent as described above. Typical curing accelerators are a phenol and a tertiary amine. Exemplary tertiary amines are similar to the tertiary amines described in [1]<7> Curing accelerator.

These compounds may be blended either as a single compound or as a mixture of two or more such compounds.

The resin composition according to the sixth aspect of the present invention may further comprise optional additives in addition to the compound (A) or the compound (B) and the phosphite ester compounds or the curing agent. For example, the resin composition may have blended therein a filler, a plasticizer, athixotropicagent, a pigment, adye, an antiaging agent, an antioxidant, an antistatic agent, a flame retardant, a tackifier, a dispersant, a solvent or the like.

Exemplary fillers, plasticizers, thixotropic agents, pigments, antiaging agents, antioxidants, antistatic agent, flame retardants, and tackifier are similar to those described in [1]<10> Additives.

The resin composition having an improved storage stability according to the sixth aspect of the present invention having the constitution as described above exhibits a storage stability higher than that of the conventional thiirane-containing resins without detracting from the high adhesive strength, the fast curing properties, and in particular, the fast curing properties at a low temperature, and the reduced odor characteristic to the thiirane-containing resin. In addition, with regard to the poor workability of the thiirane-containing resin due to its high viscosity, addition of a phosphite compound to the resin composition enables reduction of the viscosity of the entire resin composition containing the thiirane-containing resin according to sixth aspect of the present invention. Furthermore, the brownish color of the thiirane-containing resin can be weakened by the incorporation of the phosphite compound, and the composition according to sixth aspect of the present invention can be produced as a yellow to transparent composition wherein the color inherent to the thiirane-containing resin has been weakened.

The composition of the present invention wherein the phosphite ester compound is the compound having a particular structure such as a diarylmonoalkylphosphite, a diarylpentaerythritol diphosphite, or a dialkylpentaerythritol diphosphite exhibits particularly improved storage stability.

The resin composition according to the sixth aspect of the present invention produced by using a bisphenol F epoxy compound as the epoxy compound for producing the compound (A) or the compound (B) is preferable since the resin composition exhibits low viscosity, and therefore, good workability.

<7> Seventh Aspect of the Present Invention

The fast curing, one part resin composition according to the seventh aspect of the present invention is a resin composition adapted for use as a coating composition, an adhesive, and the like containing a resin component wherein the oxirane ring and the thiirane ring are included at a ratio of oxirane ring/thiirane ring of 95/5 to 1/99, and a ketimine compound as a latent curing agent.

In the fast curing, one part resin composition according to the seventh aspect of the present invention, the oxirane ring and the thiirane ring are included at a ratio of oxirane ring/thiirane ring of 95/5 to 1/99, and the resin composition may comprise either the compound (A) wherein all or a part of the oxirane ring in an epoxy compound has been replaced with thiirane ring and the epoxy compound (B) which only has oxirane ring in the molecule, or solely the compound (A) when the compound (A) has both the thiirane ring and the oxirane ring. The compound (A) may be either a compound (A-1) wherein the oxirane ring in the molecule of the epoxy compound has been entirely replaced with thiirane ring so that the molecule includes only the thiirane ring; or a compound (A-2) wherein the oxirane ring in the molecule has been only partly replaced with thiirane ring so that the molecule includes both the thiirane ring and the oxirane ring.

To be more specific, the resin component of the fast curing, one part resin composition according to the seventh aspect of the present invention may be any one of the following compositions comprising different combination of the components:

(i) the composition containing only the compound (A-2);
(ii) the composition containing the compounds (A-1) and (B);
(iii) the composition containing the compounds (A-2) and (B);
(iv) the composition containing the compounds (A-1) and (A-2); and
(v) the composition containing the compounds (A-1), (A-2), and (B).

The composition comprising the combination (iii) is preferable because the composition exhibits high adhesive strength.

In the fast curing, one part resin composition according to the seventh aspect of the present invention, the ratio of the content of oxirane ring/thiirane ring is in the range of 95/5 to 1/99 since the resin composition exhibits good storage stability and curing properties when the ratio is within such range, and preferably in the range of 90/10 to 60/40 since the resin composition exhibits high storage stability.

The resin component of the fast curing, one part resin composition according to the seventh aspect of the present invention is preferably a liquid compound having a viscosity at 25° C. of up to 100,000 mPa·s, and preferably a compound having an equivalent of up to 450 g/eq, or a mixture of compounds having an average equivalent of up to 450 g/eq calculated in terms of the epoxy compound before the replacement with the thiirane ring. Among these, the most preferred are those derived from bisphenol A or bisphenol F having an epoxy equivalent in the range of 150 to 300. In view of the storage stability, the resin component is preferably an aliphatic epoxy compound of hydrogenated bisphenol A and the like.

The ketimine compound used in the seventh aspect of the present invention is a compound which can be synthesized from a ketone and a polyamine.

When the ketimine compound is blended with the resin composition containing the thiirane ring (hereinafter also referred to as the thiirane-containing resin) in the fast curing, one part resin composition according to the seventh aspect of the present invention, the resulting composition exhibits fast curing properties as well as low temperature curability (for example, curability at a temperature not more than 5°, or 0° C.) Since ketimine compound is a liquid of low viscosity, incorporation of the ketimine compound in the thiirane-containing resin having a high viscosity and high susceptibility to crystallization results in the prevention of the crystallization and reduction in viscosity of the thiirane-containing resin.

The polyamine and the ketone which may be used as the starting materials in the synthesis of the ketimine compound, and the exemplary combinations of the polyamine and the ketone are like those described in [1]<6> Ketimine compound.

Of the ketimine compound as described above, the most preferred are ketimine compounds synthesized from a compound containing primary amino group which is bonded to the secondary or tertiary carbon and a ketone. The fast curing, one part resin composition according to the seventh aspect of the present invention containing such ketimine as the latent curing agent exhibits excellent storage stability.

Examples and preferable examples of the compounds containing primary amino group which is bonded to the secondary or tertiary carbon and the ketone, and the exemplary combination of the compounds containing primary amino group which is bonded to the secondary or tertiary carbon and the ketone are similar to those indicated in [1]<6> Ketimine compound.

Of the ketimine compounds, the preferred are those synthesized from a compound containing primary amino group bonded to primary carbon and a ketone having a substituent at α position. Use of such ketimine compounds results in the improved storage stability in the absence of water.

Examples and preferable examples of the amino group-containing compound having a primary amino group bonded to the primary carbon atom and the ketone having a substituent at α position; and the examples and preferable examples of the combination of the amino group-containing compound having a primary amino group and the ketone having a substituent at α position are similar to those indicated in [1]<6> Ketimine compound.

It should be noted that, in the seventh aspect of the present invention, an aldimine synthesized from an aldehyde and an amine can be employed instead of the ketimine compound synthesized from the ketone and the amine as described above in a manner equivalent to the case of the ketimine compound.

In the fast curing, one part resin composition according to the seventh aspect of the present invention, the ketimine compound is preferably added at an equivalent ratio of the (imino group in the ketimine compound )/(oxirane ring and thiirane ring in the resin component of the resin composition according to the seventh aspect of the present invention) in the range of 0.1 to 2.0, and more preferably in the range of 0.3 to 1.5. When the ketimine is added at an amount in such range, the resulting composition will exhibit satisfactory storage stability as well as excellent curability.

The fast curing, one part resin composition according to the seventh aspect of the present invention containing the thiirane-containing resin and the ketimine compound as the critical components may further contain a phosphite ester compound. The fast curing, one part resin composition according to the seventh aspect of the present invention containing the phosphite ester compound simultaneously with the the thiirane-containing resin exhibits a storage stability drastically improved over that of the composition containing the thiirane-containing resin but free from the phosphite ester compound, while the low temperature curability and the adhesion are maintained at an equivalent level. Among the various phosphite ester compounds, use of a compound having a structure with reduced steric hindrance around the phosphorus atom is effective in improving the storage stability.

The phosphite ester compound is also a compound which is liquid with low viscosity, and addition of a phosphite ester compound to the thiirane-containing resin can suppress tendency of the thiirane-containing resin to undergo crystallization. The viscosity of the composition is also reduced by such addition of the phosphite ester compound to result in the improvement of the workability.

The phosphite ester compounds used in the seventh aspect of the present invention may be selected from various compounds which are esters of phosphonic acid, and preferably, the phosphite ester compound is at least one phosphite ester compound selected from the group consisting of the phosphite ester compounds represented by the structural formulae (2) and (3) in [1]<8> Phosphite ester compound.

Examples of the phosphite ester compounds are similar to the exemplary compounds and preferable compounds thereof described for the structural formulae (2) and (3) in [1]<8> Phosphite ester compound, and commercially available phosphite ester compounds and the preferable products are like those indicated in [1]<8> Phosphite ester compound.

The phosphite ester compounds preferable in view of the compatibility and the phosphite ester compounds preferable in view of the storage stability are similar to those described in [1]<8> Phosphite ester compound.

The phosphite ester compound may be used either alone or in combination of two or more.

The phosphite ester compound may be incorporated at an amount in the range described in [1]<8> Phosphite ester compound.

The fast curing, one part resin composition according to the seventh aspect of the present invention may be produced as a one part composition wherein the resin component as described above is mixed with the ketimine compound, or alternatively, as a two part composition wherein the resin component as described above and the ketimine compound are separately produced for subsequent mixing at a predetermined mixing ratio before its use.

The fast curing, one part resin composition according to the seventh aspect of the present invention may further comprise a curing accelerator in addition to the ketimine compound as described above. Typical curing accelerators are a phenol and a tertiary amine. Exemplary tertiary amines are similar to the compounds described in [1]<7> Curing accelerator.

These compounds may be blended either as a single compound or as a mixture of two or more such compounds.

The fast curing, one part resin composition according to the seventh aspect of the present invention may further comprise optional additives in addition to the resin component, the ketimine compound or the phosphite ester compound, and the curing accelerator. For example, the composition may have blended therein a filler, a plasticizer, a thixotropic agent, a pigment, a dye, an antiaging agent, an antioxidant, an antistatic agent, a flame retardant, a tackifier, a dispersant, a solvent or the like.

Exemplary fillers, plasticizers, thixotropic agents, pigments, antiaging agents, antioxidants, antistatic agent, flame retardants, and tackifier are similar to those described in [1]<10> Additives.

In the fast curing, one part resin composition according to the seventh aspect of the present invention having the constitution as described above, the storage stability can be improved over that of the conventional thiirane-containing resins without detracting from the high adhesive strength, the fast curing properties, and in particular, the fast curing properties at a low temperature, and the reduced odor characteristic to the thiirane-containing resins. In addition, with regard to the poor workability of the thiirane-containing resin due to its high viscosity, addition of a ketimine compound which is a liquid of low viscosity enables reduction of the viscosity of the entire fast curing, one part resin composition according to the seventh aspect of the present invention.

Furthermore, the composition of the present invention containing the ketimine compound has been prevented from crystallization while the thiirane-containing resins are highly susceptible to crystallization.

The fast curing, one part resin composition according to the seventh aspect of the present invention exhibits particularly improved storage stability when the ketimine compound incorporated is a ketimine compound synthesized from a compound having primary amino group bonded to the secondary or tertiary carbon and a ketone, or a ketimine compound synthesized from a compound having primary amino group bonded to the primary carbon and a ketone having a substituent at the α position.

The fast curing, one part resin composition according to the seventh aspect of the present invention exhibits further improved storage stability when the phosphite ester compound incorporated is a compound having the particular structure represented by the structural formula (2) or (3), since the autopolymerization of the thiirane-containing resin is suppressed.

The resin composition according to the seventh aspect of the present invention produced by using a bisphenol F epoxy compound as the epoxy compound for producing the compound (A) or the compound (B) is preferable since the resin composition exhibits low viscosity, and therefore, good workability.

<8> Eighth Aspect of the Present Invention

The resin composition according to the eighth aspect of the present invention is a resin composition containing the compound (A) or the compounds (A) and (B) and a liquid glycidylamine compound wherein weight ratio of said resin component to said liquid glycidylamine compound is in the range of 95/5 to 60/40.

The resin composition according to the eighth aspect of the present invention may be the one containing both of the compound (A-1) which has only thiirane ring and the compound (A-2) which has both thiirane ring and oxirane ring; the one containing only the compound (A-2); or the one containing the compound (A) with the compound (B). For example, the resin composition may be any one of the following compositions comprising different combination of the components:

(i) the composition containing only the compound (A-2);
(ii) the composition containing the compounds (A-1) and (B);
(iii) the composition containing the compounds (A-2) and (B);
(iv) the composition containing the compounds (A-1) and (A-2); and (v) the composition containing the compounds (A-1), (A-2), and (B).

The composition comprising the combination (iii) is preferable because the composition exhibits high adhesive strength.

In the resin composition according to the eights aspect of the present invention, the ratio of the content of oxirane ring/thiirane ring is in the range of 95/5 to 1/99 when a composition exhibiting low temperature curability is to be obtained, and preferably in the range of 90/10 to 60/40 when a composition exhibiting high adhesive strength is to be obtained.

The resin composition according to the eights aspect of the present invention may contain a liquid glycidylamine compound as a reactive diluent in addition to the thiirane-containing resin as described above. The liquid glycidylamine compound then functions to prevent the crystallization of the resin composition.

The thiirane-containing resin produced from a bisphenol A epoxy compound is particularly susceptible to crystallization, and incorporation of the liquid glycidylamine compound is particularly effective in suppressing the crystallization of the resin composition according to the eighth aspect of the present invention containing such thiirane-containing resin.

Upon curing of the resin composition, the liquid glycidylamine compound reacts with and bonds to the functional group of the thiirane-containing resin.

The liquid glycidylamine compound used in the eighth aspect of the present invention may be a liquid glycidylamine compound having at least one glycidyl group and at least one amino group. The merits of preventing the crystal formation and reduction in viscosity are attained because the glycidylamine compound is liquid. The liquid glycidylamine compound is preferably the one having a freezing point of not more than 0° C., and in view of realizing acceptable curability in cold district, liquid glycidylamine compound is preferably the one having a freezing point of not more than −40° C.

The glycidylamine compound is preferably a diglycidylamine compound having two glycidyl groups in view of the satisfactory mechanical properties of the cured product.

The liquid glycidylamine compound is preferably blended at a weight ratio of the resin component to the liquid glycidylamine compound of 95/5 to 60/40, and preferably, 90/10 to 70/30. When the content of the liquid glycidylamine compound is too low, the merits of the present invention according to the eighth aspect of the present invention are not fully realized while too much incorporation results in poor mechanical properties of the cured product.

Examples of the liquid glycidylamine compound are similar to those described in [1]<9> Reactive diluent: liquid glycidylamine compound. Use of diglycidylaniline(DGA) and diglycidyltoluidine(DGT) is particularly preferable.

The resin composition according to the eighth aspect of the present invention may preferably contain a phosphite ester compound since incorporation of a phosphite ester compound is effective in improving the storage stability.

The phosphite ester compound is a liquid compound having a low viscosity. On the other hand, thiirane-containing resin has a viscosity higher than the epoxy resin which has oxirane ring instead of the thiirane ring. As a consequence, addition to the thiirane-containing resin of the phosphite ester compound results in the reduction in the viscosity the composition containing the thiirane-containing resin and improved workability.

The phosphite ester compounds used in the eighth aspect of the present invention may be at least one phosphite ester compound selected from the group consisting of the phosphite ester compounds represented by the structural formulae (2) and (3) in [1]<8> Phosphite ester compound.

Examples of the phosphite ester compounds represented by the structural formulae (2) and (3) and examples of the commercially available phosphite ester compounds are similar to those indicated in [1]<8> Phosphite ester compound.

The phosphite ester compound may be incorporated at an amount in the range described in [1]<8> Phosphite ester compound.

The resin composition according to the eighth aspect of the present invention may further comprise a curing accelerator in addition to the curing agent as described above. Typical curing accelerators are a phenol and a tertiary amine. Exemplary tertiary amines are similar to the compounds described in [1]<7> Curing accelerator. These compounds may be blended either as a single compound or as a mixture of two or more such compounds.

The composition of the present invention may further comprise optional additives such as a filler, a plasticizer, a thixotropic agent, a pigment, a dye, an antiaging agent, an antioxidant, an antistatic agent, a flame retardant, a tackifier, a dispersant, a solvent, or the like.

Exemplary fillers, plasticizers, thixotropic agents, pigments, antiaging agents, antioxidants, antistatic agent, flame retardants, and tackifier are similar to those described in [1]<10> Additives.

The resin composition according to the eighth aspect of the present invention having the liquid glycidylamine compound, and in particular, the liquid glycidyldiamine compound incorporated therein as described above exhibits lower viscosity and higher resistance to crystallization as well as higher resistance to the loss of outer appearance and improved workability compared to the conventional thiirane-containing resins without detracting from the high adhesive strength, the fast curing properties, and in particular, the fast curing properties at a low temperature, and the reduced odor characteristic to the thiirane-containing resin.

The resin composition according to the sixth aspect of the present invention produced by using a bisphenol F epoxy compound as the epoxy compound for producing the compound (A) or the compound (B) is preferable since the resin composition exhibits low viscosity, and therefore, good workability.

EXAMPLES

The present invention is hereinafter described in detail by referring to Examples and Comparative Examples which by no mean's limit the scope of the invention.

<Examples According to First Aspect of the Invention>

Synthesis Examples 1 of Compound Containing Thiirane Ring 121 g of potassium thiocyanate was dissolved in a mixed solvent of 75 ml of ethanol and 100 ml of water. To this mixture was added 85 g of bisphenol A diglycidyl ether, and the mixture was allowed to stand for 4 hours. To the mixture was added another 85 g of bisphenol A diglycidyl ether, and the mixture was vigorously stirred at room temperature for 40 hours. The solution was then extracted with chloroform, and the extract was washed with water and dried over magnesium sulfate to dry the reaction mixture. After distilling off the chloroform under reduced pressure, the residue was dried under reduced pressure to obtain the reaction product.

The reaction product was measured for the ratio of the thiirane ring/oxirane ring content by NMR. The ratio was measured to be 55/45.

The procedure of the synthesis as described above was repeated by using bisphenol A epoxy resin (2) (manufactured by Dow Chemical; product name DER332), and replacing all or a part of the oxirane ring in the bisphenol A epoxy resin (2) with the thiirane ring to produce the compound having a ratio of the thiirane ring/oxirane ring content of 80/20, 50/50, 30/70, and 100/0 (hereinafter referred to as resin (2) containing 80% thiirane; resin (2) containing 50% thiirane; resin (2) containing 30% thiirane; and resin (2) containing 100% thiirane, respectively).

Also produced in a similar manner was a compound wherein the ratio of the thiirane ring/oxirane ring content is 80/20 in aliphatic epoxy resin (3) (manufactured by Asahi Denka Kogyo K.K.; product name, EP 4080) (hereinafter referred to as resin (3) containing 80% thiirane).

The procedure of the Synthesis Example 1 was repeated except that the mixed solvent of methanol and water was replaced with acetone. The reaction product obtained was evaluated by NMR for the ratio of the thiirane ring/oxirane ring content. The ratio was 90/10.

Synthesis Examples 3 of Compound Containing Thiirane Ring

A 3-neck flask with an inner volume of 2 liters equipped with a mechanical stirrer was charged with a solution of 0.25 equivalents of epoxy resin in 300 ml methanol. To this solution was added dropwise a solution of 0.375 equivalents of thiourea in 300 ml methanol at room temperature for 45 minutes, and the mixture was allowed to react for 12 hours with stirring. The reaction mixture was then poured into cold water, washed three times with a methanol/water mixed solvent, and dissolved in methylene chloride. After washing with water, and removing the methylene chloride under reduced pressure, the residue was dried under reduced pressure to obtain the reaction product.

The reaction product obtained was evaluated by NMR for the ratio of the thiirane ring/oxirane ring content. The ratio was 90/10.

[Peel Strength]

2 metal pieces each having a size of 100 mm×25 mm×2 mm were prepared, and a test piece was prepared from these metal pieces in accordance with JIS K6850 by coating the adhesive composition to an area of 12.5×25 mm on one edge of the metal piece, and joining the two metal pieces with the adhesive-coated area facing with each other to thereby prepare the test piece. The test piece was evaluated for the peel strength by a tensile shear test at a speed of 50 mm/min.
copper plate (JIS C1220)
steel plate (JIS G3141)
aluminum plate (JIS A1050)

Peel strength was also evaluated for vulcanized rubber and polycarbonate by tensile shear test in the similar manner. The vulcanized rubber used was the one having the following composition.

Vulcanized rubber
  NR, 100 parts by weight
  CB, 40 parts by weight
  ZnO, 5 parts by weight
  stearic acid, 1 part by weight
  sulfur, 2.1 parts by weight

[Curing Time]

The adhesive composition prepared was allowed to stand at 20° C., and the curing time was measured in terms of the time elapsed before the loss of tack (tack free time).

Examples 1 to 5 and Comparative Examples 1 to 5

The adhesive composition of the formulation as shown in Table 1 was prepared in each of the Examples and Comparative Examples for use in the evaluation of the peel strength and the curing time. The results are shown in Table 1.

TABLE 1

|  |  | Examples |  |  |  |  | Comparative Examples |  |  |  |  |  |
| --- | --- | --- | --- | --- | --- | --- | --- | --- | --- | --- | --- | --- |
|  |  | 1 | 2 | 3 | 4 | 5 | 1 | 2 | 3 | 4 | 5 | 6 |
| Formulation | Main part |  |  |  |  |  |  |  |  |  |  |  |
|  | Bisphenol A epoxy resin (1) |  |  |  |  | 50 | 100 |  | 50 |  |  |  |
|  | Bisphenol A epoxy resin (2) |  |  |  |  |  |  | 100 | 50 |  | 50 |  |
|  | Aliphatic epoxy resin (3) |  |  |  |  |  |  |  |  | 100 | 50 |  |
|  | Resin (2) containing 80% thiirane | 100 |  |  |  |  |  |  |  |  |  |  |
|  | Resin (2) containing 50% thiirane |  | 100 |  |  |  |  |  |  |  |  |  |
|  | Resin (2) containing 30% thiirane |  |  | 100 |  | 50 |  |  |  |  |  |  |
|  | Resin (3) containing 80% thiirane |  |  |  | 100 |  |  |  |  |  |  |  |
|  | Resin (3) containing 100% thiirane |  |  |  |  |  |  |  |  |  |  | 100 |
|  | Curing agent |  |  |  |  |  |  |  |  |  |  |  |
|  | Heterocyclic amine curing agent | 91.5 | 91.2 | 91.0 | 62.4 | 87.2 | 83.4 | 91.0 | 87.2 | 65.9 | 78.5 | 90.5 |
| Peel | Copper plate (Mpa) | 4.6 | 5.8 | 4.8 | 3.7 | 3.5 | 2.2 | 1.9 | 2.1 | 1.3 | 1.6 | 1.7 |
| strength | Steel plate (Mpa) | 17.0 | 20.8 | 17.3 | 13.6 | 14.5 | 3.9 | 3.5 | 3.7 | 2.3 | 2.9 | 3.3 |
|  | Aluminum plate (Mpa) | 23.5 | 29.8 | 24.8 | 18.8 | 14.8 | 4.4 | 3.9 | 4.2 | 2.6 | 3.3 | 3.2 |
|  | Vulcanized rubber (Mpa) | 1.6 | 2.0 | 1.7 | 1.5 | 1.6 | 1.2 | 1.1 | 1.1 | 0.8 | 0.9 | 0.8 |
|  | Polycarbonate (Mpa) | 5.1 | 6.6 | 5.5 | 4.1 | 4.6 | 3.8 | 3.6 | 3.7 | 2.0 | 2.8 | 2.7 |
| Curing time (min.) |  | 17 | 22 | 26 | 15 | 28 | 35 | 31 | 33 | 40 | 35 | 20 |

In the table, the unit of the compound is part by weight.

Note:
Bisphenol A epoxy resin (1): manufactured by Sumitomo Chemical K.K.; product name, ELA-128
Bisphenol A epoxy resin (2): manufactured by Dow Chemical; product name, DER332
Aliphatic epoxy resin (3): manufactured by Asahi Denka Kogyo K.K.; product name, EP4080
Heterocyclic amine curing agent: manufactured by Yuka Shell Epoxy K.K.; product name, Epomate QX-2
Resin (2) containing 80% thiorane: the compound wherein oxirane ring of bisphenol A epoxy resin (2) is partly replaced with thiirane ring to a thiirane ring/oxirane ring ration of 80/20

Resin (2) containing 50% thiirane: the compound within oxirane ring of bisphenol A epoxy resin (2) is partly replaced with thiirane ring to a thiirane ring/oxirane ring ratio of 50/50

Resin (2) containing 30% thiirane: the compound wherein oxirane ring of bisphenol A epoxy resin (2) is partly replaced with thiirane ring to a thiirane ring/oxirane ring ratio of 30/70

Resin (3) containing 80% thiirane: the compound wherein oxirane ring of aliphatic epoxy resin (3) is partly replaced with thiirane ring to a thiirane ring/oxirane ring ratio of 80/20

Resin (2) containing 100% thiirane: the compound wherein oxirane ring of bisphenol A epoxy resin (2) is entirely replaced with thiirane ring

Examples 6 to 13 and Comparative Examples 7 to 8

The adhesive compositions were synthesized-in accordance with the formulation shown in Table 2 for evaluation of curability and adhesion.

[Curing Time]

The adhesive composition prepared was allowed to stand at 10° C., and the curing time was measured in terms of the time elapsed before the loss of tack (tack free time).

[Peel Strength]

2 pieces of pure aluminum plates (JIS A1050) each having a size of 100 mm×25 mm×2 mm were prepared, and a test piece was prepared from these metal pieces in accordance with JIS K6850 by coating the adhesive composition to an area of 12.5×25 mm on one edge of the aluminum plate, and joining the two plates with the adhesive-coated area facing with each other to thereby prepare the test piece. The test piece was evaluated for the peel strength by a tensile shear test at a speed of 50 mm/min.

The results are shown in Table 2.

Note:

Polyamideamine: manufactured by Sanwa Chemical Industry K.K.; product name, SUNMIDE 301D (active amine hydrogen equivalent, 150)

Resin (1) containing 30% thiirane: the compound wherein oxirane ring of bisphenol A epoxy resin (1) is partly replaced with thiirane ring to an thiirane ring/oxirane ring ratio of 30/70

Resin (1) containing 50% thiirane: the compound wherein oxirane ring of bisphenol A epoxy resin (1) is partly replaced with thiirane ring to an thiirane ring/oxirane ring ratio of 50/50

Resin (1) containing 70% thiirane: the compound wherein oxirane ring of bisphenol A epoxy resin (1) is partly replaced with thiirane ring to a thiirane ring/oxirane ring ratio of 70/30

Examples 14 to 17 and Comparative Examples 9 to 13

The adhesive compositions were synthesized in accordance with the formulation shown in Table 3, below for evaluation of curing time and adhesion.

[Pot Life]

Pot life was determined in the scale of 50 g by measuring the time elapsed before the occurrence of pronounced increase in viscosity in accordance with the method described in JIS K 6833, testing method for conditions of use, "pot life".

[Curing Time]

The adhesive compositions were prepared and allowed to stand at the predetermined temperatures (20° C., 0° C.), and the time before the loss of the tack and development of Shore hardness of 60 as measured by Shore D hardness tester was measured.

[Peel Strength]

2 pieces of steel plates (JIS G 3142) each having a size of 100 mm×25 mm×2 mm were prepared, and a test piece was prepared from these metal pieces in accordance with JIS

TABLE 2

| | | | Examples | | | | | | | Comparative Examples | |
|---|---|---|---|---|---|---|---|---|---|---|---|
| | | 6 | 7 | 8 | 9 | 10 | 11 | 12 | 13 | 7 | 8 |
| Formulation | Main part | | | | | | | | | | |
| | Bisphenol A epoxy resin (1) | | | | | | | 20 | | 100 | 100 |
| | Resin (1) containing 30% thiirane (x = 30%) | 100 | 100 | 100 | | | | 100 | 100 | | |
| | Resin (1) containing 50% thiirane (x = 50%) | | | | 100 | | 80 | | | | |
| | Resin (1) containing 70% thiirane (x = 70%) | | | | | 100 | | | 100 | | |
| | Curing agent | | | | | | | | | | |
| | Polyamide amine | 86 | 56 | 48 | 48 | 21 | 58 | 96 | 29 | 98 | 69 |
| Amount of amine added, per 1 equivalent (y) | | 0.9 | 0.6 | 0.5 | 0.5 | 0.3 | 0.6 | 1.0 | 0.3 | 1 | 0.7 |
| Curing time (min.) | | 144 | 146 | 154 | 98 | 55 | 150 | 140 | 180 | 296 | 480 |
| Peel strength (aluminum plate, MPa) | | 23.2 | 29.6 | 22.6 | 28.6 | 27.5 | 28.8 | 20.5 | 9.8 | 20.0 | 10.4 |

In the table, the unit of the compound is part by weight.

K6850 by coating the adhesive composition to an area of 12.5×25 mm² on one edge of the aluminum plate, and joining the two plates which the adhesive-coated area facing with each other and allowing to stand at 20° C. or 0° C. for 5 days, depending on each temperature condition to thereby prepare the test piece. The test piece was evaluated for the peel strength by a tensile shear test at a speed of 50 mm/min.

The results are shown in Table 3, below.

Comparative Example 13 is the case wherein the resin containing 3% thiirane was cured with an alicyclic polyamine compound, and in this case, curing time at 0° C. was as long as 72 hours. Use of such composition at low temperature is impractical.

Note:
Bisphenol A epoxy resin (1): manufactured by Sumitomo Chemical K.K.; product name, ELA-128

TABLE 3

| | | Examples | | | | Comparative Examples | | | | |
|---|---|---|---|---|---|---|---|---|---|---|
| | | 14 | 15 | 16 | 17 | 9 | 10 | 11 | 12 | 13 |
| Formulation | Main part | | | | | | | | | |
| | Bisphenol A epoxy resin (1) | | | | | 100 | 100 | 100 | | |
| | Resin (1) containing 30% thiirane | 100 | 100 | 100 | 100 | | | | | |
| | Resin (1) containing 3% thiirane | | | | | | | | | 100 |
| | Resin (1) containing 100% thiirane | | | | | | | | 100 | |
| | Curing agent | | | | | | | | | |
| | Polyamide amine | | 8 | | 40 | 40 | | | | |
| | Alicyclic polyamine compound | 30 | 24 | | | | 30 | | 30 | 30 |
| | Modified alicyclic polyamine compound | | | 50 | | | | 50 | | |
| Curing at 20° C. | | | | | | | | | | |
| Pot life (min.) | | 36 | 30 | 38 | 18 | 25 | 40 | 42 | 20 | 38 |
| Curing time (hr.) | | 18 | 17 | 20 | 16 | 18 | 24 | 24 | 12 | 23 |
| Peel strength (MPa) | | 12.0 | 16.8 | 15.5 | 16.5 | 14.8 | 10.5 | 10.3 | 8.3 | 10.6 |
| Curing at 0° C. | | | | | | | | | | |
| Pot life (min.) | | 300 | 240 | 300 | 100 | 120 | 720 | 840 | 180 | 700 |
| Curing time (hr.) | | 36 | 36 | 38 | 36 | 72 | 84 | 96 | 24 | 72 |
| Peel strength (MPa) | | 11.5 | 15.5 | 13.3 | 14.5 | 13.5 | 7.0 | 6.3 | 7.8 | 8.5 |

In the table, the unit of the compound is part by weight.

Examples 14 and 16 are the examples wherein the resin containing 30% thiirane was cured with an alicyclic polyamine compound or a resin containing such compound. When compared to Example 17 wherein the resin was cured by polyamide amine alone, the pot life at 0° C. was extended more than twice in the cases of Examples 14 and 16 compared to that of the Example 17 with no substantial increase in the cure time. Superior workability at low temperatures is thereby demonstrated.

Example 15 is an example wherein the curing agent used was combination of a polyamide amine and an alicyclic polyamine compound.

Comparative Examples 9 to 11 are the examples wherein the bisphenol A epoxy resin was cured with different curing agents. Curing at 20° C. of these Comparative Examples is acceptable. In contrast, curing at 0° C. was unduly slow especially in the case of curing with an alicyclic polyamine compound and a modified alicyclic polyamine compound (Comparative Examples 10 and 11), and unsuitability of the use of such curing agent at low temperature is thereby demonstrated.

Curing at 0° C. was also slow in the case of the curing with a polyamide amine (Comparative Example 9). Use of such composition at low temperatures is impractical.

As will be evident by comparing Comparative Examples 9, 10 and 11, pot life increases in correlation with the curing time when conventional bisphenol A epoxy resins are cured, and use of an alicyclic polyamine-based curing agent with longer pot life results in the prolonged curing time.

Comparative Example 12 is the case wherein the resin containing 100% thiirane was cured with an alicyclic polyamine compound, and in this case, peel strength (bond strength) was insufficient.

Polyamide amine: manufactured by Sanwa Chemical Industry K.K.; product name, SUNMIDE X-2000 (active amine hydrogen equivalent, 90)

Alicylic polyamine compound (isophorone diamine): manufactured by Huls (amine value, 41)

Modified alicylic polyamine compound (3-aminomethyl-3, 5,5-trimethylcyclohexylamine-bisphenol A diglycidyl ether adduct; manufactured by Sanwa Chemical Industry K.K.; product name, SUNMIDE IM-544 (active amine hydrogen equivalent, 100)

Resin (1) containing 30% thiirane: the compound wherein oxirane ring of bisphenol A epoxy resin (1) is partly replaced with thiirane ring to an thiirane ring/oxirane ring ratio of 30/70

Resin (1) containing 3% thiirane: the compound wherein oxirane ring of bisphenol A epoxy resin (1) is partly replaced with thiirane ring to a thiirane ring/oxirane ring ratio of 3/97

Resin (1) containing 100% thiirane: the compound wherein oxirane ring of bisphenol A epoxy resin (1) is entirely replaced with thiirane ring Examples According to Second Aspect of the Invention Examples 18 to 22 and Comparative Examples 14 to 16

Sealant compositions for civil engineering and construction purposes were synthesized in accordance with the formulation shown in Table 4 for evaluation of curability, tensile strength and adhesion.

[Curing Time]

The resin composition prepared was allowed to stand at 20° C., and the curing time was measured in terms of the time elapsed before the loss of tack (tack free time).

[Tensile Strength]

The tensile strength was evaluated in accordance with the procedure described in JIS K7113. The test piece used was Type No. 1, and the tensile speed was 50 mm/min.

[Peel Strength]

The peel strength was evaluated in accordance with the procedure described in JIS K6850. The adherends employed were as described below.

steel plate (JIS G3141)

polyvinyl chloride 3001 manufactured by Mitsubishi Plastics Inc.

With regard to adhesion to mortar, the resin compositions produced in the Examples and Comparative Examples were applied to an area of 12.5×25 mm on one edge of the mortal substrate having a thickness of 10 mm to conduct the peeling test.

The results are shown in Table 4, below.

Aminosilane tackifier: manufactured by Japan Uniker K.K.; product name, AQ-1121

Polysulfide resin: manufactured by Thiokol Chemical; product name, LP-3

Amine catalyst: manufactured by Toray Thiokol; product name, DMP-30

Polyamide amine: manufactured by Sanwa Chemical Industry K. K.; product name, SUNMIDE 315 (active amine hydrogen equivalent, 125)

Tin catalyst: curing agent for SILYL; manufactured by Sankyo YukiGosei K.K.; product name, No. 918

Examples According to Third Aspect of the Invention

The procedure of the Synthesis Example 1 of the thiirane ring-containing compound as described above was repeated by using bisphenol A epoxy resin (1) (manufactured by

TABLE 4

| | | Examples | | | | | Comparative Examples | | |
|---|---|---|---|---|---|---|---|---|---|
| | | 18 | 19 | 20 | 21 | 22 | 14 | 15 | 16 |
| Formulation | Main part | | | | | | | | |
| | Bisphenol A epoxy resin (1) | | | | 25 | | 100 | 50 | 100 |
| | Resin (1) containing 90% thiirane | | 100 | | 25 | 30 | | | |
| | Resin (1) containing 50% thiirane | 50 | | 50 | | | | | |
| | Calcium carbonate | | 50 | 50 | 50 | 50 | 50 | 50 | 50 |
| | Silica | | 5 | 5 | 5 | 5 | 5 | 5 | 5 |
| | Epoxy plasticizer | | 50 | 50 | 50 | | 50 | 50 | |
| | DOP | | | | | 100 | | | 100 |
| | Silicone resin | | | | | 70 | | | 70 |
| | Aminosilane tackifier | | | | | 1 | | | 1 |
| | Curing agent | | | | | | | | |
| | Polysulfide resin | 50 | | 50 | 50 | | | 50 | |
| | DMP-30 | 5 | 5 | 5 | 5 | | 5 | 5 | |
| | Polyamide amine | | | | | 2 | | | 2 |
| | Tin-based curing agent | | | | | 0.8 | | | 0.8 |
| | Distilled water | | | | | 0.2 | | | 0.2 |
| Curing time (min.) | | 16 | 19 | 26 | 22 | 29 | 62 | 48 | 70 |
| Tensile strength | | | | | | | | | |
| Strength at break (MPa) | | 8.9 | 5.4 | 4.1 | 3.2 | 5.2 | 24.6 | 18.5 | 11.6 |
| Elongation at break (%) | | 120 | 120 | 160 | 175 | 210 | 20 | 60 | 110 |
| Adhesion | | | | | | | | | |
| Tensile shear strength, steel plate (MPa) | | 22.2 | 22.5 | 23.4 | 22.4 | 21.4 | 20.0 | 23.4 | 18.6 |
| Tensile shear strength, mortar (MPa) | | *1 | *1 | *1 | *1 | *1 | *1 | *1 | *1 |
| Tensile shear strength, vinyl chloride (MPa) | | *2 | *2 | *2 | *2 | *2 | *2 | *2 | *2 |

In the table, the unit of the compound is part by weight.
*1 Breakage of mortar substrate
*2 Breakage of vinyl chloride substrate Resin (1) containing 90% thiirane: the compound wherein oxirane ring of bisphenol A epoxy resin (1) is partly replaced with thiirane ring to an thiirane ring/oxirane ring ratio of 90/10

Resin (1) containing 50% thiirane: the compound wherein oxirane ring of bisphenol A epoxy resin (1) is partly replaced with thiirane ring to a thiirane ring/oxirane ring ratio of 50/50

Calcium carbonate: manufactured by Maruo Calcium K.K.; product name, MS-700

Silica: manufactured by Nippon Aerosil K.K.; product name, AEROSIL200

Epoxy plasticizer: diglycidyl ether of 1,6-hexanediol

Modified silicone resin: manufactured by Kaneka Corporation; product name, SAT200, SILYL standard grade Sumitomo chemical K.K.; product name, ELA-128), and replacing all or a part of the oxirane ring in the bisphenol A epoxy resin (1) with the thiirane ring to produce the compound having the ratio of the thiirane ring/oxirane ring content of 80/20, 50/50, 30/70, 20/80, and 99/1 (hereinafter referred to as resin (1) containing 80% thiirane; resin (1) containing 50% thiirane; resin (1) containing 30% thiirane; resin (1) containing 20% thiirane; and resin (1) containing 99% thiirane, respectively).

Also produced in a similar manner was a compound wherein the ratio of the thiirane ring/oxirane ring content is 80/20 in aliphatic epoxy resin (2) (manufactured by Asahi Denka Kogyo K.K.; product name, EP4080) (hereinafter referred to as resin (2) containing 80% thiirane).

Examples 3-1 to 3-6 and Comparative Examples 3-1 to 3-3

The composition of the formulation as shown in Table 5 was prepared in each of the Examples and Comparative Examples for use in the evaluation of the pot life, the peel strength (adhesion to the adherend) and the curing time (curability) The results are shown in Table 5.

It should be noted that the coating compositions prepared by further blending 50 parts by weight of talc as the modifying filler per 100 parts by weight of the composition obtained in each of Examples 3-1 to 3-6 also exhibited excellent curability and good adhesion to the substrate.

[Pot Life]

Stability during the period between the preparation of the composition and the start of the coating operation was observed by using Comparative Example 3-1 (Prior Art Example 1) for the reference. The composition of Comparative Example 3-1 exhibited good stability in the period of about 10 minutes before the start of the coating operation. In the table, ○ indicates stability during the storage equivalent to that of Comparative Example 3-1, and ⊚ indicates particularly good stability.

[Peel Strength]

2 pieces of steel plate (JIS G3141) each having a size of 100 mm×25 mm×2 mm were prepared, and a test piece was prepared from these metal pieces in accordance with JIS K6850 by coating the adhesive composition to an area of 12.5×25 mm on one edge of the steel plate, and joining the two plates with the adhesive-coated area facing with each other to thereby prepare the test piece. The test piece was evaluated for the peel strength by a tensile shear test at a speed of 50 mm/min. Corresponding tensile shear test was also conducted for polycarbonate.

[Curing Time]

The composition prepared was allowed to stand at 20° C., and the curing time was measured in terms of the time elapsed before the loss of tack (tack free time).

Note:

Bisphenol A epoxy resin (1): manufactured by Sumitomo Chemical K.K.; product name, ELA-128

Aliphatic epoxy resin (2): manufactured by Asahi Denka Kogyo K.K.; product name, EP4080

Heterocyclic amine curing agent: manufactured by Yuka Shell Epoxy K.K.; product name, Epomate QX-2

Resin (1) containing 99% thiirane: the compound wherein oxirane ring of bisphenol A epoxy resin (1) is partly replaced with thiirane ring to a thiirane ring/oxirane ring ratio of 99/1

Resin (1) containing 80% thiirane: the compound wherein oxirane ring of bisphenol A epoxy resin (1) is partly replaced with thiirane ring to a thiirane ring/oxirane ring ratio of 80/20

Resin (1) containing 50% thiirane: the compound wherein oxirane ring of bisphenol A epoxy resin (1) is partly replaced with thiirane ring to a thiirane ring/oxirane ring ratio of 50/50

Resin (1) containing 30% thiirane: the compound wherein oxirane ring of bisphenol A epoxy resin (1) is partly replaced with thiirane ring to a thiirane ring/oxirane ring ratio of 30/70

Resin (2) containing 80% thiirane: the compound wherein oxirane ring of bisphenol A epoxy resin (2) is partly replaced with thiirane ring to a thiirane ring/oxirane ring ratio of 80/20

Examples According to Fourth Aspect of the Invention

The procedure of the Synthesis Example 1 of the thiirane ring-containing compound as described above was repeated by using bisphenol A epoxy resin (1) (manufactured by Sumitomo Chemical K.K.; product name, ELA-128), and replacing all or a part of the oxirane ring in the bisphenol A epoxy resin (1) with the thiirane ring to produce the compound having the ratio of the thiirane ring/oxirane ring content of 50/50 (hereinafter referred to as resin (1) containing 50% thiirane).

TABLE 5

|  |  | Examples | | | | | | Comparative Examples | | |
|---|---|---|---|---|---|---|---|---|---|---|
|  |  | 3-1 | 3-2 | 3-3 | 3-4 | 3-5 | 3-6 | 3-1 | 3-2 | 3-3 |
| Formulation | Main part | | | | | | | | | |
|  | Bisphenol A epoxy resin (1) |  |  |  |  |  | 50 | 100 |  | 50 |
|  | Aliphatic epoxy resin (2) |  |  |  |  |  |  |  | 100 | 50 |
|  | Resin (1) containing 99% thiirane (x = 99%) | 100 |  |  |  |  |  |  |  |  |
|  | Resin (1) containing 80% thiirane (x = 80%) |  | 100 |  |  |  |  |  |  |  |
|  | Resin (1) containing 50% thiirane (x = 50%) |  |  | 100 |  |  |  |  |  |  |
|  | Resin (1) containing 30% thiirane (x = 30%) |  |  |  | 100 |  | 50 |  |  |  |
|  | Resin (2) containing 80% thiirane (x = 80%) |  |  |  |  | 100 |  |  |  |  |
|  | Talc | 50 | 50 | 50 | 50 | 50 | 50 | 50 | 50 | 50 |
|  | Curing agent | | | | | | | | | |
|  | Heterocyclic amine curing agent | 10 | 30 | 50 | 70 | 62.4 | 87.2 | 83.4 | 65.9 | 78.5 |
| Pot life |  | ○ | ○ | ○ | ○ | ○ | ○ | ○ | ⊚ | ⊚ |
| Adhesion to substrate |  | | | | | | | | | |
| Steel plate (MPa) |  | 12 | 14 | 16.8 | 14.2 | 11.2 | 11.6 | 3.1 | 1.9 | 2.3 |
| Polycarbonate (MPa) |  | 3.9 | 4.1 | 5.4 | 4.4 | 3.3 | 3.7 | 3.1 | 1.6 | 2.2 |
| Drying time (min.) |  | 22 | 19 | 24 | 28 | 17 | 30 | 37 | 61 | 53 |

In the table, the unit of the compound is part by weight.

Resin (1) containing 50% thiirane: the compound wherein oxirane ring of bisphenol A epoxy resin (1) is partly replaced with thiirane ring to a thiirane ring/oxirane ring ratio of 50/50

Examples 4-1 to 4-6 and Comparative Examples 4-1 to 4-2

The composition of the formulation as shown in Table 6 was prepared in each of the Examples and Comparative Examples for use in the evaluation of curability (tack free time), electric insulation (volume resistivity), adhesion (tensile shear strength) and flame retardancy. The results are shown in Table 6.

[Curability]

The composition prepared was allowed to stand at 20° C., and the curing time was measured in terms of the time elapsed before the loss of tack (tack free time).

[Electric Insulation]

The measurement was conducted in accordance with the procedure described in JIS K6911 by applying electricity at 50 V for 1 minute. The sample used for the measurement was the one which had been left at room temperature for 3 days. The electric insulation was determined in terms of volume resistivity.

[Adhesion]

2 pieces of copper plates (JIS C1020) each having a size of 100 mm×25 mm×2 mm were prepared, and a test piece was prepared from these metal pieces in accordance with JIS K6850 by coating the adhesive composition to an area of 12.5×25 mm on one edge of the steel plate, and joining the two metal plates with the adhesive-coated area facing with each other to thereby prepare the test piece. The test piece was evaluated for the peel strength by a tensile shear test at a speed of 50 mm/min. Corresponding tensile shear test was also conducted for an aluminum plate (JIS A2024P).

[Flame Retardancy]

A copper clad laminate of 6 in.×0 5 in. (thickness, 1 mm) impregnated with the composition produced in Examples and Comparative Examples was used for the test sample. The test sample was evaluated for the flame-out time in accordance with vertical method of UL standard by mounting the test piece with its longitudinal axis extending in vertical direction. A flame was applied to the lower edge of the sample for 10 seconds, and the flame-out time was then measured, and this procedure was repeated for 4 times.

The results are shown in Table 6.

TABLE 6

| | | Examples | | | | | | Comparative Examples | |
|---|---|---|---|---|---|---|---|---|---|
| | | 4-1 | 4-2 | 4-3 | 4-4 | 4-5 | 4-6 | 4-1 | 4-2 |
| Formulation | Main part | | | | | | | | |
| | Bisphenol A epoxy resin (1) | | | | | | | 50 | 100 |
| | Resin (1) containing 50% thiirane | 50 | 70 | 50 | 50 | 70 | 50 | | |
| | Brominated epoxy resin (2) | 50 | 30 | 50 | 50 | 30 | 50 | 50 | |
| | Flame retardant, antimony pentaoxide | 5 | 5 | 5 | 5 | 5 | | 5 | |
| | Filler, silica | 0.5 | 0.5 | 0.5 | 0.5 | 0.5 | 0.5 | 0.5 | 0.5 |
| | Curing agent | | | | | | | | |
| | Polyamide amine | 32 | 31 | 41 | 45 | 10 | 32 | 46 | 66 |
| Thiirane content (%) | | 33 | 42 | 33 | 33 | 42 | 33 | 0 | 0 |
| Amine equivalent | | 0.7 | 0.6 | 0.9 | 1.0 | 0.2 | 0.7 | 1.0 | 1.0 |
| Curability, tack free time (min.) | | 45 | 28 | 41 | 47 | 35 | 42 | 185 | 126 |
| Electric insulation, volume resistivity (standard state), (Ω · cm) | | $2.3 \times 10^{14}$ | $4.7 \times 10^{14}$ | $3.1 \times 10^{14}$ | $2.1 \times 10^{14}$ | $8.9 \times 10^{14}$ | $2.0 \times 10^{14}$ | $4.5 \times 10^{14}$ | $8.0 \times 10^{14}$ |
| Adhesion, tensile shear strength | | | | | | | | | |
| Copper, (MPa) | | 22.5 | 27.9 | 22.5 | 21.6 | 9.6 | 24.5 | 15.9 | 20.0 |
| Aluminum, (MPa) | | 18.9 | 19.7 | 18.9 | 17.2 | 8.5 | 19.9 | 11.8 | 16.0 |
| Flame retardancy | | Self estinguishing | Self estinguishing | Self estinguishing | Self estinguishing | Self estinguishing | — | Self estinguishing | Inflammation |

In the table, the unit of the compound is part by weight.

Note:
Bisphenol A epoxy resin (1): manufactured by Sumitomo Chemical K.K.; product name, ELA-128
Brominated epoxy resin (2): manufactured by Sumitomo Chemical K.K.; product name, ESB-340, bromine content, 46 to 50% by weight epoxy equivalent, 330 to 380
Antimony pent-oxide: manufactured by Nissan Chemical K.K.
Silica: manufactured by Nippon Aerosil K.K.; product name, AEROSIL200
Polyamideamine: manufactured by Sanwa Chemical Industry K.K.; product name, SUNMIDE 315 (active amine hydrogen equivalent, 125)
Resin (1) containing 50% thiirane: the compound wherein oxirane ring of bisphenol A epoxy resin (1) is partly replaced with thiirane ring to a thiirane ring/oxirane ring ratio of 50/50

Examples According to Fifth Aspect of the Invention

Examples 5-1 to 5-4 and Comparative Examples 5-1 to 5-4

First, the resin compositions of the formulation as shown in Table 7 free from the curing agent were prepared. The resulting resin compositions were evaluated for their moisture content and storage stability at a high temperature. The resin compositions were then admixed with an epoxy resin curing agent, and the resulting resin compositions were evaluated for the curability at a low temperature (0° C.) and shear bond strength. The results are shown in Table 7.

[Moisture Content]

Moisture content was measured by titration using Karl Fischer moisture meter.

[High Temperature Storage Stability at 60° C.]

The resin compositions free from the curing agent produced in the Examples and the Comparative Examples were determined for their viscosity immediately after their preparation, and the resin compositions were then placed in a sealed container. After leaving at 60° C. for 2 weeks, the resin compositions were taken out of the container to evaluate the viscosity after the storage which was divided by the viscosity of the as-prepared resin composition to thereby calculate the change in viscosity. The viscosity was measured at 20° C. using type E viscometer with a cone spindle of 3 degrees.

[Low Temperature Curability at 0° C.]

The resin compositions free from the curing agent were admixed with an epoxy resin curing agent (polyamide amine, SUNMIDE 315, manufactured by Sanwa Chemical Industry K. K.), and the thus prepared resin compositions were left at 0° C. for 6 hours and evaluated for their cure by visual inspection. ○ indicates that the compositions were cured and × indicates that the compositions were uncured.

[Shear Bond Strength]

2 pieces of steel plates (JIS G3101) each having a size of 100 mm×25 mm×2 mm were prepared, and a test piece was prepared from these metal pieces in accordance with JIS K6850 by coating the adhesive composition to an area of 12.5×25 mm on one edge of the metal plate, and joining the two plates with the adhesive-coated area facing with each other to thereby prepare the test piece. The test piece was evaluated for the peel strength by a tensile shear test at a speed of 50 mm/min.

Epoxy resin: ELA-128 manufactured by Sumitomo Chemical K.K.; bisphenol A epoxy resin; epoxy equivalent 190
Resin containing 80% thiirane: ELA-128 manufactured by Sumitomo Chemical K.K. modified to a thiirane content of 80%
Resin containing 30% thiirane: ELA-128 manufactured by Sumitomo Chemical K.K. modified to a thiirane content of 30%
Resin containing 10% thiirane: ELA-128 manufactured by Sumitomo Chemical K.K. modified to a thiirane content of 10%
Resin containing 2% thiirane: ELA-128 manufactured by Sumitomo Chemical K.K. modified to a thiirane content of 2% (Thiirane content was determined by subjecting the resins containing the thiirane at different contents to NMR and measuring the area of the peak from thiirane ring for calculation.)
Montmorillonite: Snectite SA manufactured by Kunimine Kogyo K.K.
Vinylsilane: A-171, manufactured by Japan Uniker K.K.

Examples According to Sixth Aspect of the Invention

Examples 6-1 to 6-4 and Comparative Examples 6-1 to 6-4

The compounds shown in Table 8 were blended in accordance with the formulation shown in Table 8 (in parts by weight except for the values in bracket which indicate number of moles) to prepare the resin compositions. The resulting resin compositions were evaluated for their storage stability. The resin compositions were then admixed with an epoxy resin curing agent, and the resulting compositions were evaluated for curability at a low temperature (5° C.) and shear bond strength. The results are shown in Table 8.

[Storage Stability]

The resin compositions free from the curing agent produced in the Examples and the Comparative Examples were determined for their viscosity immediately after their preparation, and the resin compositions were then placed in a sealed container. After leaving at 70° C. for 1 day, the resin compositions were determined for their viscosity after the storage which was divided by the viscosity of the as-prepared resin composition to thereby calculate the change in viscosity. The viscosity was measured at 20° C. using type E viscometer with the cone spindle of 3 degrees.

TABLE 7

|  | Comparative Examples | | Examples | | | | Comparative Examples | |
| --- | --- | --- | --- | --- | --- | --- | --- | --- |
|  | 5-1 | 5-2 | 5-1 | 5-2 | 5-3 | 5-4 | 5-3 | 5-4 |
| Epoxy resin |  |  |  |  |  |  |  | 100 |
| Resin containing 80% thiirane (x = 80%) | 100 |  |  |  |  |  |  |  |
| Resin containing 30% thiirane (x = 30%) |  | 100 |  | 100 | 100 | 100 |  |  |
| Resin containing 10% thiirane (x = 10%) |  |  | 100 |  |  |  |  |  |
| containing 2% thiirane (x = 2%) |  |  |  |  |  |  | 100 |  |
| Molecular sieve |  |  |  | 10 |  |  |  |  |
| Montmorillonite |  |  |  |  | 10 |  |  |  |
| Vinylsilane |  |  |  |  |  | 2 |  |  |
| Moisture content (ppm) | 502 | 889 | 235 | 110 | 89 | 522 | 328 | 583 |
| 1000 - 10x (ppm) | 200 | 700 | 900 | 700 | 700 | 700 | 980 | 1000 |
| Storage stability, change in viscosity (fold) after two week storage at 60° C. | Not measurable | 14.8 | 3.7 | 2.8 | 1.8 | 2.5 | 1.4 | 1.1 |
| Curing agent, polyamide amine | 20 | 40 | 53 | 40 | 40 | 40 | 57 | 58 |
| Low temperature curability and adhestion (two part cure) |  |  |  |  |  |  |  |  |
| Curability at 0° C. | ○ | ○ | ○ | ○ | ○ | ○ | X | X |
| Shear bond strength (MPa) | 8.9 | 15.6 | 16.0 | 14.4 | 14.8 | 15.1 | 12.7 | 11.4 |

The unit of the compounds is parts by weight

[Low Temperature Curability]

The resin compositions free from the curing agent were admixed with an epoxy resin curing agent (modified alicyclic polyamine curing agent, EH-3895, manufactured by Asahi Denka Kogyo K.K.), and the thus prepared resin compositions were left at 5° C. for 1 hour and evaluated for their cure by visual inspection. ○ indicates that the viscosity after the leaving was higher than the viscosity of the as-produced resin composition by the factor of 3 or more, and × indicates that the factor was less than 3.

[Shear Bond Strength]

2 pieces of steel plates (A2024P) each having a size of 100 mm×25 mm×2 mm were prepared, and a test piece was prepared from these metal pieces in accordance with JIS K6850 by coating the adhesive composition to an area of 12.5×25 mm on one edge of the metal plate, and joining the two metal plates with the adhesive-coated area facing with each other to thereby prepare the test piece. The test piece was evaluated for the peel strength by a tensile shear test at a speed of 50 mm/min.

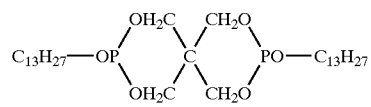

Phosphite compound 2: JPP-88 manufactured by Johoku Kagaku Kogyo K.K.;

a mixture of phosphite compounds

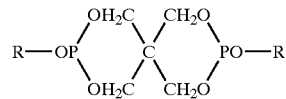

R: $C_{13}H_{27}$ and/or

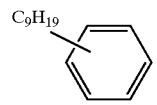

TABLE 8

|  | Comparative Examples | | Examples | | | | Comparative Examples | | Examples | |
| --- | --- | --- | --- | --- | --- | --- | --- | --- | --- | --- |
|  | 6-1 | 6-2 | 6-1 | 6-2 | 6-3 | 6-4 | 6-3 | 6-4 | 6-5 | 6-5 |
| Bisphenol A epoxy resin (1) | 100 | | | | | | | | | |
| Bisphenol F epoxy resin (2) | | | | | | | | | 100 | |
| Resin (1) containing 30% thiirane | | 100 | 100 | 100 | 100 | 100 | 100 | 100 | | |
| Resin (2) containing 30% thiirane | | | | | | | | | | 100 |
| Phosphite ester compound 1 | | | 5 (0.009) | | | | | | | |
| Phosphite ester compound 2 | | | | 3 (0.005) | 8 (0.013) | | | | | |
| Phosphite ester compound 3 | | | | | | 4 (0.011) | | | | 4 (0.011) |
| Butyl phenyl glycidyl ether | | | | | | | 5 | | | |
| Vinylsilane | | | | | | | | 5 | | |
| Storage stability, change in viscosity (fold) after one day storage at 70° C. | 0.98 | 1.55 | 1.21 | 1.25 | 0.96 | 0.97 | 1.50 | 1.51 | 0.98 | 0.99 |
| Curing agent, EH-3895 | 60 | 60 | 60 | 60 | 60 | 60 | 60 | 60 | 54 | 54 |
| Low temperature curability and adhestion (two part cure) | | | | | | | | | | |
| Curability at 5° C. | X | ○ | ○ | ○ | ○ | ○ | ○ | ○ | X | ○ |
| Shear bond strength (MPa) | 9.6 | 11.3 | 12.0 | 11.8 | 11.0 | 11.2 | 10.6 | 10.2 | 9.8 | 11.1 |

Bisphenol A epoxy resin (1): ELA-128 manufactured by Sumitomo Chemical K.K.; epoxy equivalent 190

Resin (1) containing 30% thiirane: ELA-128 manufactured by Sumitomo Chemical K.K. modified to a thiirane content of 30%

Bisphenol F epoxy resin (2): EPICLON 830 manufactured by Dainippon Ink & Chemicals, Inc.; epoxy equivalent, 170

Resin (2) containing 30% thiirane: EPICLON 830 manufactured by Dainippon Ink & Chemicals, Inc. modified to a thiirane content of 30%

Phosphite compound 1: JPP-13 manufactured by Johoku Kagaku Kogyo K.K.

Phosphite compound 3: JPM-311 manufactured by Johoku Kagaku Kogyo K.K.

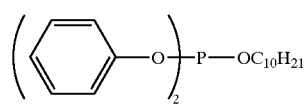

Butylphenyl glycidyl ether (diluent): Denacol EX-146 manufactured by Nagase Kasei Kogyo K.K.

Vinylsilane (moisture absorbent): A-171, manufactured by Japan Uniker K.K.

The resin compositions of the Comparative Examples 6-1 and 6-5 are general-purpose epoxy resins, and these compositions hardly exhibited viscosity increase after storage at 70° C. for 1 day. The resin composition of Comparative Example 6-2 is a thiirane-containing resin, and this composition exhibited increase in viscosity of 1.5 folds after storage at 70° C. for 1 day, indicating inferior storage stability.

In contrast, the increase in viscosity was suppressed in Examples 6-1 and 6-2 to the level of approximately 1.2 folds, and in Examples 6-3 to 6-5, the increase in viscosity was suppressed and the storage stability was equivalent to that of the epoxy resin.

The resin composition of Comparative Example 6-3 which has butylphenyl glycidyl ether blended as a diluent still suffered from insufficient storage stability. The resin composition of Comparative Example 6-4 which has a vinylsilane compound blended as a moisture absorbent also suffered from insufficient storage stability.

Increase in viscosity after storage at 70° C. for 1 day is preferably not more than approximately 1.2 folds.

When EH-3985 was blended as an epoxy resin curing agent and the resin compositions were left at a low temperature of 5° C. for 1 hour, the resin compositions exhibited sufficient curability except for the case of Comparative Example 6-1 wherein the viscosity increase was less than three folds.

The shear bond strength was also sufficient.

As evident from the results as described above, thiirane-containing resins do not detract from their (low temperature) curability or adhesion when they are blended with the phosphite compounds.

It should also be noted that the resin compound of Comparative Example 6-2 was brown while the resin compositions of Examples 6-1 to 6-5 were pale yellow to transparent.

Examples According to Seventh Aspect of the Invention

Examples 7-1 to 7-5 and Comparative Examples 7-1 to 7-4

The compounds shown in Table 9 were blended in accordance with the formulation shown in Table 9 (in parts by weight) to prepare the resin compositions. The resulting resin compositions were evaluated for their storage stability, curability and curability at a low temperature (0° C.). The results are shown in Table 9.

[Change in Viscosity (Evaluation of Storage Stability)]

The resin compositions produced in the Examples and the Comparative Examples were determined for their viscosity immediately after their preparation, and the resin compositions were then placed in a sealed container. After leaving at 70° C. for 1 day, the resin compositions were determined for their viscosity after the storage which was divided by the viscosity of the as-prepared resin composition to thereby calculate the change in viscosity. The unit is fold. The viscosity was measured at 20° C. using type E viscometer with a cone spindle of 3 degrees.

[Tack Free Time (Evaluation of Curability)]

The time required until no tack of was observed between a polyethylene sheet and the surface of the resin composition was measured in a thermostatic chamber at a temperature of 20° C. and a relative humidity of 56%. The unit is hours.

[Curing Test at 0° C. (Evaluation of Low Temperature Curability]

The resin compositions were prepared and left in a low temperature oven of 0° C. ○ indicates that the tack free state was observed within 72 hours and × indicates that the tack free state was not observed within 72 hours.

TABLE 9

|  | Comparative Examples | | | Examples | | | | Comparative Examples | Examples |
| --- | --- | --- | --- | --- | --- | --- | --- | --- | --- |
|  | 7-1 | 7-2 | 7-3 | 7-1 | 7-2 | 7-3 | 7-4 | 7-4 | 7-5 |
| Bisphenol A epoxy resin (1) | 100 | 100 |  |  | 33 | 50 |  | 96 |  |
| Bisphenol F epoxy resin (2) |  |  | 100 |  |  |  |  |  |  |
| Resin (1) containing 30% thiirane |  |  |  | 100 | 67 | 50 |  | 4 |  |
| Resin (1) containing 95% thiirane |  |  |  |  |  |  |  |  |  |
| Resin (2) containing 30% thiirane |  |  |  |  |  |  | 100 |  |  |
| Hydrogenated A-30 |  |  |  |  |  |  |  |  | 100 |
| Phosphite ester compound |  |  |  |  | 3.4 | 2.5 | 4 |  |  |
| Ketimine A | 38 |  |  |  |  |  |  |  | 38 |
| Ketimine B |  | 43 | 48 | 43 | 43 | 43 | 48 | 43 |  |
| Thiirane content (%) | 0 | 0 | 0 | 30 | 20 | 15 | 30 | 1.2 | 30 |
| Storage stability, change in viscosity (fold) after one day storage at 70° C. | 150.5 | 3.0 | 3.1 | 3.0 | 1.5 | 1.2 | 2.7 | 2.9 | 6.5 |
| Curability, tack free time (hr.) | 19 | 25 | 26 | 6 | 8 | 9 | 6 | 25 | 11 |
| Curing test at 0° C. | X | X | X | ○ | ○ | ○ | ○ | X | ○ |

Bisphenol A epoxy resin (1): Epiclon 840; epoxy equivalent, 190; manufactured by Dainippon Ink & Chemicals, Inc.

Bisphenol F epoxy resin (2): Epiclon 830; epoxy equivalent, 170; manufactured by Dainippon Ink & Chemicals, Inc.

Resin (1) containing 30% thiirane: Epiclon 840modified to a thiirane content of 30% (oxirane ring/thiirane ring 70/30)

Resin (1) containing 95% thiirane: Epiclon 840 modified to a thiirane content of 95%

Resin (2) containing 30% thiirane: Epiclon 830 modified to a thiirane content of 95%

Hydrogenated A-30: Hydrogenated bisphenol A epoxy resin; EP-4080 (epoxy equivalent 240; manufactured by Asahi Denka Kogyo K.K.) modified to a thiirane content of 30% (oxirane ring/thiirane ring=70/30)

Phosphite compound: JPM-311; Diphenylmonodecyl phosphite; molecular weight 374; manufactured by Johoku Kagaku Kogyo K.K.

Ketimine A: a ketimine compound; H-30 manufactured by Yuka Shell K.K. a ketimine synthesized by using methyl isobutyl ketone for the ketone Ketimine B: A ketimine compound represented by the following formula:

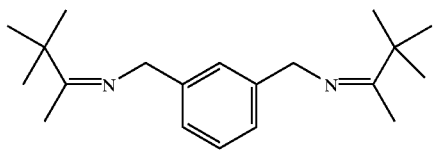

Examples According to Eighth Aspect of the Invention

Examples 8-1 to 8-6 and Comparative Examples 8-1 to 8-7

First, the resin compositions of the formulation as shown in Table 10 free from the curing agent were prepared. The resulting resin compositions were observed for clouding, and evaluated for their initial viscosity and change in viscosity after leaving them at 70° C. for 1 day. The resin compositions were then admixed with a modified alicyclic polyamine curing agent (EH-3895 manufactured by Asahi Denka Kogyo K.K.), and the resulting resin compositions were evaluated for the curing speed. The results are shown in Table 10. The unit of the compound in the table is parts by weight.

[Clouding]

The resin compositions free from the curing agent were placed in a sealed container. After leaving at 20° C. for 1 month, the resin compositions were taken out of the container and evaluated for their state by visual inspection. The resin composition which exhibited clouding was evaluated "Yes", and the one which exhibited no clouding was evaluated "No".

[Initial Viscosity and Change in Viscosity]

The resin compositions free from the curing agent produced in the Examples and the Comparative Examples were determined for their viscosity immediately after their preparation, and the resin compositions were then placed in a seaLed container. After leaving at 70° C. for 1 day, the resin compositions were taken out of the container and determined for the viscosity which was divided by the initial viscosity to thereby calculate the factor of increase in viscosity. The viscosity was measured at 20° C. using type E viscometer with the cone spindle of 3 degrees.

[Curing Speed]

The resin compositions free from the curing agent were admixed with an equal amount of a modified alicyclic polyamine curing agent, and the resulting resin compositions were left at 5° C. for 30 minutes. The viscosity immediately after mixing of the curing agent and the viscosity after 30 minutes were measured by the procedure as described above, and change in viscosity was calculated by dividing the viscosity after 30 minutes with the viscosity immediately after mixing of the curing agent.

TABLE 10

| | Comparative Examples | | | | Examples | | |
|---|---|---|---|---|---|---|---|
| | 8-1 | 8-2 | 8-3 | 8-4 | 8-1 | 8-2 | 8-3 |
| Epoxy resin | | | | | | | |
| Resin containing 30% thiirane | 100 | 80 | 80 | 80 | 80 | 80 | 80 |
| Glycidyl ether compound 1 | | 20 | | | | | |
| Glycidyl ether compound 2 | | | 20 | | | | |
| Glycidyl ether compound 3 | | | | 20 | | | |
| Liquid glycidylamine compound 1 | | | | | 20 | | |
| Liquid glycidylamine compound 2 | | | | | | 20 | 20 |
| Liquid glycidylamine compound 3 | | | | | | | |
| Liquid glycidylamine compound 4 | | | | | | | |
| Phosphite ester compound | | | | | | | |
| Clouding | Yes | Yes | Yes | Yes | No | No | No |
| Initial viscosity (mPa · s) | 128400 | 12200 | 5600 | 3575 | 10300 | 15650 | 10075 |
| Change in viscosity (fold) after one day storage at 70° C. | 1.29 | 1.24 | 1.23 | 1.25 | 1.22 | 1.17 | 1.10 |
| Curing speed, change in viscosity (fold) | 2.91 | 2.65 | 2.78 | 2.72 | 2.78 | 2.78 | 2.74 |

| | Examples | | | Comparative Examples | | |
|---|---|---|---|---|---|---|
| | 8-4 | 8-5 | 8-6 | 8-5 | 8-6 | 8-7 |
| Epoxy resin | | | | 80 | | |
| Resin containing 30% thiirane | 70 | 80 | 80 | | 98 | 40 |
| Glycidyl ether compound 1 | | | | | | |
| Glycidyl ether compound 2 | | | | | | |
| Glycidyl ether compound 3 | | | | | | |
| Liquid glycidylamine compound 1 | | | | 20 | | |
| Liquid glycidylamine compound 2 | 30 | | | | 2 | 60 |
| Liquid glycidylamine compound 3 | | 20 | | | | |
| Liquid glycidylamine compound 4 | | | 20 | | | |
| Phosphite ester compound | | 4 | 4 | | | |
| Clouding | No | No | No | No | Yes | No |
| Initial viscosity (mPa · s) | 9327 | 22250 | 8327 | 4875 | 116540 | 6200 |
| Change in viscosity (fold) after one day storage at 70° C. | 1.20 | 1.22 | 1.20 | 1.11 | 1.28 | 1.15 |
| Curing speed, change in viscosity (fold) | 2.62 | 2.71 | 2.82 | 1.13 | 2.82 | 1.3 |

Epoxy resin: Epicote 828 manufactured by Yuka Shell Epoxy K.K.; bisphenol A epoxy resin; epoxy equivalent 190

Resin containing 30% thiirane: Epicote 828 manufactured by Yuka Shell Epoxy K.K. modified to a thiirane content of 30%

(Thiirane content was determined by subjecting the resins containing the thiirane at different contents to NMR and measuring the area of the peak from thiirane ring for calculation.)

Glycidyl ether compound 1: trimethylol propane triglycidyl ether

Glycidyl ether compound 2: neopentyl glycol diglycidyl ether

Glycidyl ether compound 3: hexanediol diglycidyl ether

Liquid glycidylamine compound 1: diglycidyl o-toluidine manufactured by Nippon Kayaku K.K.

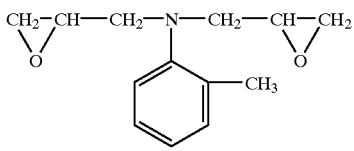

Liquid glycidylamine compound 2: diglycidyl aniline manufactured by Nippon Kayaku K.K.

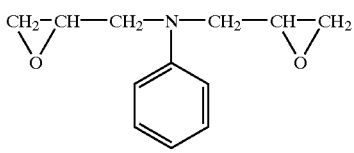

Liquid glycidylamine compound 3: tetraglycidyl m-xylilenediamine; TETRAD X manufactured by Mitsubishi Gas Chemical Co., Inc.

Liquid glycidylamine compound 4: 1,3-bis(N,N'-diglycidyl-aminomethyl)cyclohexane; TETRAD C manufactured by Mitsubishi Gas Chemical Co., Inc.

Phosphite ester compound: diphenylmonodecyl phosphite; JPM-311; manufactured by Johoku Kagaku Kogyo K.K.

Clouding by crystal formation was observed in Comparative Example 8-1 free from the reactive diluent and Comparative Examples 8-2 to 8-4 which had a general-purpose diluent, glycidyl ether compound blended therein. Comparative Example 8-5 wherein the epoxy resin was the only resin component suffered from inferior curing speed. Clouding was not avoided in Comparative Example 8-6 which contained an excessively low content of the liquid glycidylamine compound while Comparative Example 8-7 containing an excessive amount of liquid glycidylamine compound suffered from reduced reactivity, and hence, reduced curing speed. Examples 8-1 to 8-6 exhibited excellent appearance and clouding by crystallization of the resin composition was avoided in these examples, and at the same time, the low viscosity and the fast curing properties as well as excellent appearance were maintained.

Examples 8-7 to 8-14 and Comparative Examples 8-8 to 8-10

First, the resin compositions of the formulation as shown in Table 11 free from the curing agent were prepared. The resulting resin compositions were evaluated for their initial viscosity and change in viscosity after leaving at 70° C. for 1 day, and observed for crystal formation after leaving at 70° C. for 1 day. The resin compositions were then admixed with a modified alicyclic polyamine curing agent (EH-3895 manufactured by Asahi Denka Kogyo K.K.) which is an epoxy resin curing agent, and the resulting resin compositions were evaluated for curability at low temperature (0° C.) and shear bond strength. The results are shown in Table 11. The unit of the compound in the table is parts by weight.

The shear bond strength was measured by the same procedure as the measurement of the shear bond strength in <Examples according to fifth aspect of the Invention>.

[Crystal Formation]

The resulting resin compositions were sealed in a glass bottle. After leaving at 20° C. for 1 month, the resin compositions were evaluated for the formation of crystals by visual inspection. In the table, × indicates clouding and ○ indicates no clouding.

[Curability at 0° C.]

The resin compositions free from the curing agent were admixed with a modified alicyclic polyamine curing agent (EH-3895, manufactured by Asahi Denka Kogyo K.K.), and the thus prepared resin compositions were left at 0° C. for 6 hours and evaluated for their cure by visual inspection. × indicates that the composition was tacky, Δ indicates that the composition was somewhat tacky, and ○ indicates that the composition exhibited no tack.

TABLE 11

|  | Comparative Examples | | | Examples | | | | | | | |
| --- | --- | --- | --- | --- | --- | --- | --- | --- | --- | --- | --- |
|  | 8-8 | 8-9 | 8-10 | 8-7 | 8-8 | 8-9 | 8-10 | 8-11 | 8-12 | 8-13 | 8-14 |
| Bisphenol A epoxy resin (1) | 100 |  |  |  |  |  |  |  |  |  | 20 |
| Bisphenol F epoxy resin (2) |  | 100 |  |  |  |  |  |  |  |  |  |
| Resin (1) containing 100% thiirane |  |  | 100 |  |  |  |  |  |  |  |  |
| Resin (2) containing 15% thiirane |  |  |  | 100 |  |  |  |  |  |  |  |
| Resin (2) containing 30% thiirane |  |  |  |  | 100 |  |  | 100 | 80 | 80 |  |
| Resin (2) containing 50% thiirane |  |  |  |  | 100 |  |  |  |  |  |  |
| Resin (2) containing 80% thiirane |  |  |  |  |  |  | 100 |  |  |  | 60 |
| Phosphite ester compound |  |  |  |  |  |  |  | 4 |  | 4 | 4 |
| Reactive diluent (1) |  |  |  |  |  |  |  |  | 20 |  | 20 |

TABLE 11-continued

| | Comparative Examples | | | Examples | | | | | | | |
|---|---|---|---|---|---|---|---|---|---|---|---|
| | 8-8 | 8-9 | 8-10 | 8-7 | 8-8 | 8-9 | 8-10 | 8-11 | 8-12 | 8-13 | 8-14 |
| Reactive diluent (2) | | | | | | | | | | | 20 |
| Evaluation of storage stability and crystal formation (the composition as described above was evaluated) | | | | | | | | | | | |
| Change in viscosity (fold) after one day storage at 70° C. | 1.00 | 1.01 | 1.58 | 1.19 | 1.22 | 1.32 | 1.45 | 1.15 | 1.05 | 1.02 | 1.01 |
| Crystal formation | ○ | ○ | X | ○ | ○ | ○ | ○ | ○ | ○ | ○ | ○ |
| Initial viscosity (mPa · s) | 26000 | 6625 | 150000 | 10140 | 13850 | 42000 | 72050 | 12100 | 3250 | 4150 | 4200 |
| Low temperature curability and adhesion (evaluated after adding the curing agent, EH-3895) | | | | | | | | | | | |
| Amount of EH-3895 blended (parts by weight) | 60 | 54 | 57 | 54 | 54 | 54 | 54 | 54 | 53 | 52 | 54 |
| Curability at 0° C. | X | X | ○ | Δ | ○ | ○ | ○ | ○ | ○ | ○ | ○ |
| Shear bond strength (MPa) | 9.6 | 9.8 | 10.2 | 11.3 | 12.5 | 11.1 | 10.5 | 12.4 | 11.8 | 12.0 | 13.2 |

Bisphenol A epoxy resin (1): EPICLON 840; epoxy equivalent, 190; manufactured by Dainippon Ink & Chemicals, Inc.

Bisphenol F epoxy resin (2): EPICLON 830; epoxy equivalent, 170; manufactured by Dainippon Ink & Chemicals, Inc.

Phosphite ester compound: diphenylmonodecyl phosphite; JPM-311; manufactured by Johoku Kagaku Kogyo K.K.

Reactive diluent (1): ED-503; epoxy equivalent 165, manufactured by Asahi Denka Kogyo K.K.

Reactive diluent (2): diglycidyl aniline; epoxy equivalent 135; GAN; manufactured by Nippon Kayaku K.K.

Modified alicyclic polyamine curing agent: EH-3895 manufactured by Asahi Denka Kogyo K.K.

Comparative Examples 8-8 and 8-9 are bisphenol A epoxy resin and bisphenol F epoxy resin, respectively, and these resins suffer from poor curability at 0° C. in spite of the good storage stability.

Comparative Example 8-10 is an example wherein the bisphenol A thiirane-containing resin (thiirane content, 100%) is used, and this example completely solidified and suffered from the problem of crystal formation.

Examples 8-7 to 8-14 are examples wherein bisphenol F thiirane-containing resins are used. Example 8-11 is an example wherein a phosphite compound is blended, and improvement in storage stability is evident when compared to Example 8-8.

Example 8-14 is an example wherein bisphenol A thiirane-containing resin, bisphenol F thiirane-containing resin, a reactive diluent and a phosphite compound are blended. This Example is excellent in all of the storage stability, crystal formation properties, low temperature curabilety, and adhesion, and simultaneously, in their balance.

INDUSTRIAL APPLICABILITY

As evident from the foregoing description, the adhesive composition according to the first aspect of the present invention is suitable for use as an adhesive for rubbers, metals, and plastics. The composition of the present invention exhibits particularly excellent adhesion to materials such as aluminum and stainless steel which could be only insufficiently adhered by conventional epoxy-based adhesives.

The resin composition for a sealant according to the second aspect of the present invention is suitable for use as a sealant for civil engineering and construction purposes.

The resin composition for a coating composition and a coating agent according to the third aspect of the present invention is suitable for use as a coating composition or a coating agent for metals, plastics and various other materials.

The resin composition for electric applications according to the fourth aspect of the present invention is suitable for use as a potting agent for printed circuit boards, a resin for impregnation in prepregs, casting resin of coils, resist ink for printed circuit boards, a resin for copper-clad laminate of printed circuit boards.

The resin composition according to the fifth aspect of the present invention is suitable for use as an adhesive and a coating composition for civil engineering and construction purposes.

The resin composition having improved storage stability according to the sixth aspect of the present invention is suitable for use as an adhesive, coating composition, fiber-treating agent, pavement material, rust-preventive coating composition, liner, and the like for civil engineering and construction purposes.

The fast curing, one part resin composition according to the seventh aspect of the present invention is suitable for use as an adhesive, coating composition, rust-preventive coating composition, and the like for civil engineering and construction purposes.

The resin composition according to the eighth aspect of the present invention is suitable for use as an adhesive, coating composition, fiber-treating agent, pavement material, rust-preventive coating composition, liner, and the like for civil engineering and construction purposes.

What is claimed is:

1. An adhesive composition comprising compound (A) wherein a part of the oxirane rings in an epoxy compound is replaced with thiirane rings represented by the following formula (1):

 (1)

and compound (B) which contains oxirane rings and no thiirane rings in the molecule; wherein the ratio of oxirane ring/thiirane ring is from 90/10 to 10/90.

2. An adhesive composition according to claim 1, wherein the viscosity of compound (A) or said compounds (A) and (B) is up to 100,000 mPa's at 25° C.

3. An adhesive composition according to claim 1 which is applied to a rubber, metal or plastic substrate.

4. A resin composition comprising the compound (A) wherein a part of the oxirane rings in an epoxy compound is replaced with thiirane rings represented by the following formula (1):

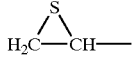 (1)

and compound (B) which contains oxirane rings and no thiirane rings in the molecule; wherein the ratio of oxirane ring/thiirane ring is from 95/5 to 1/99, and has a moisture content of: 1000-10x (ppm) or less when x represents the content (%) of thiirane.

5. A resin composition according to claim 4, further comprising 1 to 100 parts by weight of a dehydrating agent per 100 parts by weight of the compound having oxirane ring and/or thiirane ring.

6. A resin composition containing a resin component comprising compound (A) wherein a part of the oxirane rings in an epoxy compound is replaced with thiirane rings represented by the following formula (1):

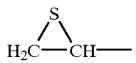 (1)

and compound (B) which contains oxirane rings and no thiirane rings in the molecule; and a phosphite ester compound; wherein the ratio of oxirane ring/thiirane ring is from 95/5 to 1/99.

7. A resin composition according to claim 6, wherein said composition contains 0.1 to 30 parts of said phosphite ester compound by weight per 100 parts of said resin component.

8. A resin composition according to claim 6 or 7, wherein said phosphite ester compound contains at least one phosphite ester compound represented by the following structural formula (2) or (3):

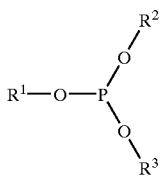 (2)

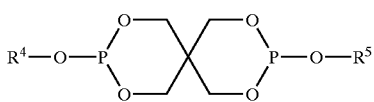 (3)

wherein $R^1$ to $R^5$ represent a hydrocarbon group containing up to 30 carbon atoms.

9. A resin composition according to claim 8, wherein said phosphite ester compound contains at least one member selected from the group consisting of phosphite ester compounds wherein at least one of $R^1$ to $R^3$ in the structural formula (2) is an aromatic ring and phosphite ester compounds wherein at least one of $R^4$ and $R^5$ in the structural formula (3) is an aromatic ring.

10. A resin composition according to claim 8, wherein said phosphite ester compound, where at least one of $R^1$ to $R^3$ in the structural formula (2) is an aromatic ring, is a diarylmonoalkylphosphite.

* * * * *